United States Patent [19]
Cox

[11] Patent Number: 5,729,468
[45] Date of Patent: *Mar. 17, 1998

[54] REDUCING PROPAGATION DELAYS IN A PROGRAMMABLE DEVICE

[75] Inventor: William D. Cox, San Jose, Calif.

[73] Assignee: QuickLogic Corporation, Sunnyvale, Calif.

[*] Notice: The term of this patent shall not extend beyond the expiration date of Pat. No. 5,526,276.

[21] Appl. No.: 520,441

[22] Filed: Aug. 29, 1995

Related U.S. Application Data

[63] Continuation-in-part of Ser. No. 231,595, Apr. 21, 1994, Pat. No. 5,526,276.

[51] Int. Cl.$^6$ .................................................. G06F 17/10
[52] U.S. Cl. ............................ 364/489; 364/488; 364/490
[58] Field of Search .................................... 364/488, 489, 364/490, 491; 326/39, 41

[56] References Cited

U.S. PATENT DOCUMENTS

| | | | |
|---|---|---|---|
| 4,916,627 | 4/1990 | Hathaway | 364/490 |
| 5,055,718 | 10/1991 | Galbraith et al. | 307/465 |
| 5,220,213 | 6/1993 | Chan et al. | 307/465 |
| 5,237,513 | 8/1993 | Kaplan | 364/490 |
| 5,282,148 | 1/1994 | Poirot et al. | 364/491 |
| 5,311,442 | 5/1994 | Fukushima | 364/488 |
| 5,359,537 | 10/1994 | Saucier et al. | 364/189 |
| 5,526,276 | 6/1996 | Cox et al. | 364/489 |

OTHER PUBLICATIONS

John P. Fishburn, "LATTIS: An Iterative Speedup Heuristic for Mapped Logic", 29th ACM/IEEE Design Automation Conference, pp. 488-491, (1992).

John P. Fishburn, "A Depth-Decreasing Heuristic for Cominational Logic; or How to Convert A Ripple-Carry Adder into a Carry-Lookahead Adder or Anything In-Between", 27th ACM/IEEE Design Automation Conference, pp. 361-364, (1990).

kanwar Jit Singh, et al., "Timing Optimization of Combinational Logic", Computer Aided Design International Conference, pp. 282-285, (1988).

1994 "Xilinx, The Programmable Logic Data Book", pp. 2-1 through 2-46 (1994).

G. De Micheli, "Technology Mapping of Digital Circuits", IEEE Computer Society Proceedings Advanced Computer Technology, Reliable Systems and Applications, 5th Annual European Computer Conference, Bologna, pp. 580-586 (1991).

R. Brayton, et al., "MIS: A Multiple-Level Logic Optimization System", IEEE Transactions On CAD, vol. CAD-6, pp. 1062-1081 (Nov. 1987).

S. Devadas, et al., "Boolean Decomposition Of Programmable Logic Arrays", IEEE 1988 Custom Integrated Circuits Conference, pp. 2.5.1-2.5.5.

R. Francis, "Chortle: A Technology Mapping Program For Lookup Table-Based Field Programmable Gate Arrays", 27th IEEE Design Automation Conference, pp. 613-619 (1990).

*Primary Examiner*—Kevin J. Teska
*Assistant Examiner*—Tyrone V. Walker
*Attorney, Agent, or Firm*—Skjerven, Morrill, MacPherson Franklin and Friel; T. Lester Wallace

[57] ABSTRACT

Select sets of a logic function corresponding to an output of a first logic circuit are determined. These select sets are used to obtain a second logic circuit, the logic function corresponding to the output of which is the same as the logic function corresponding to the output of the first logic circuit. A propagation delay through the second logic circuit may be smaller than a corresponding delay through the first logic circuit. Sometimes, such a smaller propagation delay through the second logic circuit results in the second logic circuit having a smaller critical path delay. The second logic circuit may therefore have a greater maximum operating speed than the first logic circuit.

18 Claims, 23 Drawing Sheets

Block B2

Underline denotes start point
Top bar denotes stop point

Underline denotes start point
Top bar denotes stop point

Underline denotes start point
Top bar denotes stop point

REDUCING PROPAGATION DELAYS IN A PROGRAMMABLE DEVICE

CROSS-REFERENCE TO RELATED APPLICATIONS

This application is a continuation-in-part of U.S. patent application Ser. No. 08/231,595 entitled "Select Set-Based Technology Mapping Method and Apparatus", filed Apr. 21, 1994, now U.S. Pat. No. 5,526,276.

CROSS REFERENCE TO MICROFICHE APPENDIX

The microfiche appendix consists of 2 sheets of 91 frames of microfiche. The microfiche appendix, which is a part of this patent disclosure, includes source code written in the C computer programming language for reducing critical path propagation delay in accordance with this invention. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field of the Invention

The present invention relates to reducing propagation delay in a logic circuit.

2. Background Information

A field programmable gate array (an "FPGA") is a versatile integrated circuit chip which typically includes an array of identical blocks of digital logic ("macrocells" or "modules" or "configurable logic blocks") and a programmable on-chip interconnect structure. The interconnect structure can, for example, include conductors and antifuses which can be programmed to connect selected ones of the conductors together.

An individual user can realize a desired user-specific logic circuit by mapping parts of the logic circuit with corresponding digital circuitry in the various macrocells of the FPGA. Selected ones of the conductors of the FPGA can then be connected (for example, by programming selected antifuses of the interconnect structure) so that selected input leads and selected output leads of selected macrocells are connected together in such a way that the resulting circuit is the desired user-specific circuit.

A circuit has what is called a "critical path delay" which limits the maximum operating speed of the circuit. Accordingly, if the critical path delay of the user-specific circuit could be reduced, then the maximum operating speed of the user-specific circuit could be increased. It is noted that after the mapping step there often remain unused macrocells in the FPGA. It is also noted that incorporating additional circuitry to realize the same logic function may sometimes result in increased speed. A method is therefore sought for remapping a user-specific logic circuit onto an FPGA so that the critical path delay is reduced, thereby increasing the maximum operating speed of the user-specific logic circuit.

SUMMARY

Select sets of a logic function corresponding to an output of a first logic circuit are determined. These select sets are used to obtain a second logic circuit, the logic function corresponding to the output of which is the same as the logic function corresponding to the output of the first logic circuit. A propagation delay through the second logic circuit may be smaller than a corresponding delay through the first logic circuit. Sometimes, such a smaller propagation delay through the second logic circuit results in the second logic circuit having a smaller critical path delay. The second logic circuit may therefore have a greater maximum operating speed than the first logic circuit.

In some embodiments, select sets of a logic function are determined which correspond to an output of a portion of a first logic circuit. These select sets are used to obtain a second logic circuit that has the same inputs and outputs as the first logic circuit and that comprises a portion having the same inputs and output as the portion of the first logic circuit. The logic function corresponding to the output of the portion of the second logic circuit is the same as the logic function corresponding to the output of the portion of the first logic circuit.

A propagation delay through the second logic circuit may be smaller than a corresponding propagation delay through the first logic circuit. For example, sometimes an arrival time in the second logic circuit is smaller than a corresponding arrival time in the first logic circuit. Sometimes, such a smaller arrival time through the second logic circuit results in the second logic circuit having a smaller critical path delay. The second logic circuit may therefore have a greater maximum operating speed than the first logic circuit.

Further details and aspects of using select sets to reduce propagation delays are disclosed. This summary does not purport to define the invention. The invention is defined by the appended claims.

DETAILED DESCRIPTION

Figure 1:
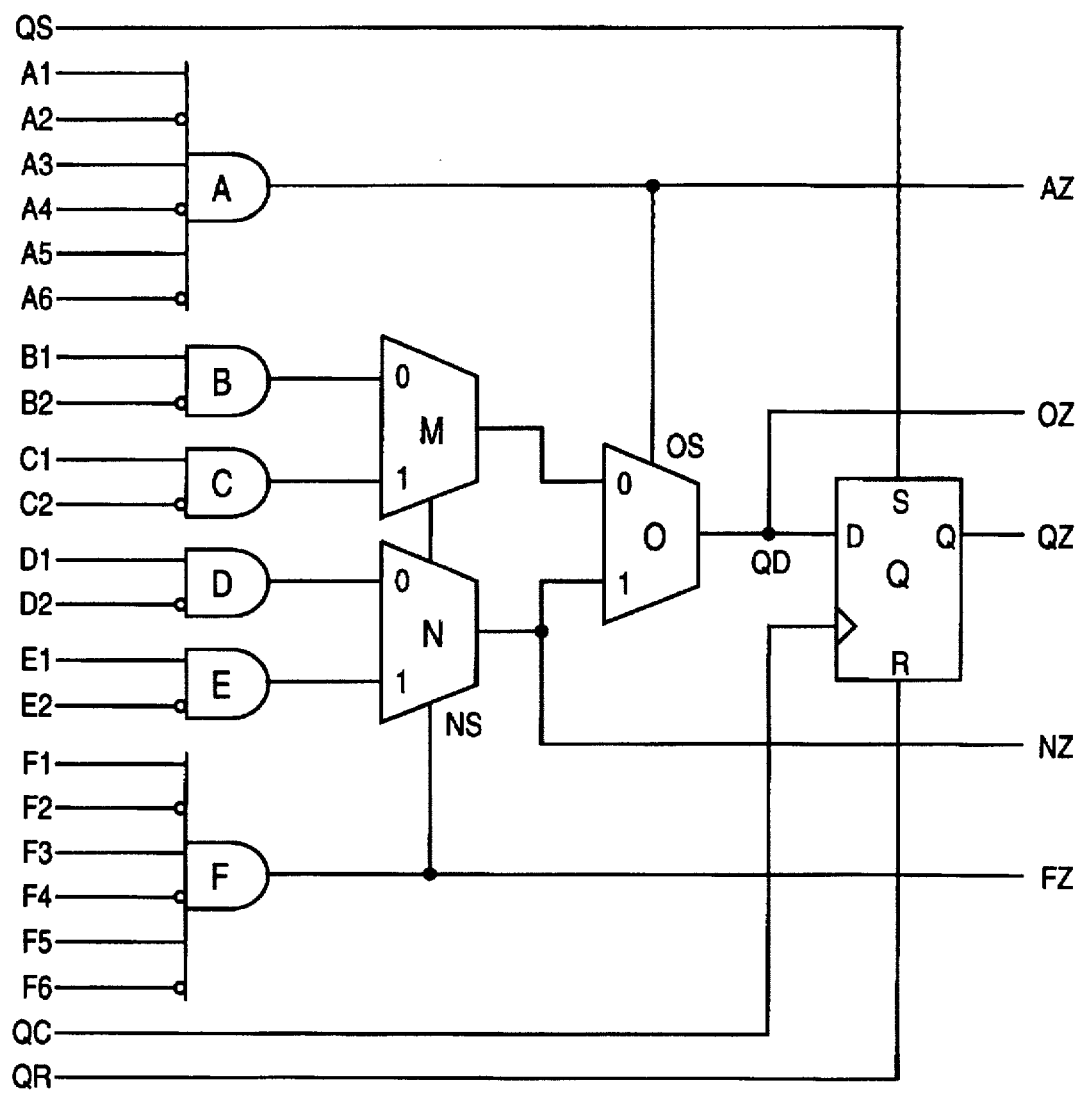
FIG. 1 is a simplified logic diagram of a macrocell.

FIG. 1 is a simplified logic diagram of a macrocell of an FPGA. References herein to a macrocell refers to the macrocell of FIG. 1 unless otherwise noted. It is, however, to be understood that the presently described embodiment is not limited to the macrocell of FIG. 1 but rather applies to other macrocells (sometimes called "logic modules" or "logic cells" or "logic blocks"), including but not limited to the macrocells set forth in U.S. Pat. No. 5,055,718.

Overview

Figure 2:
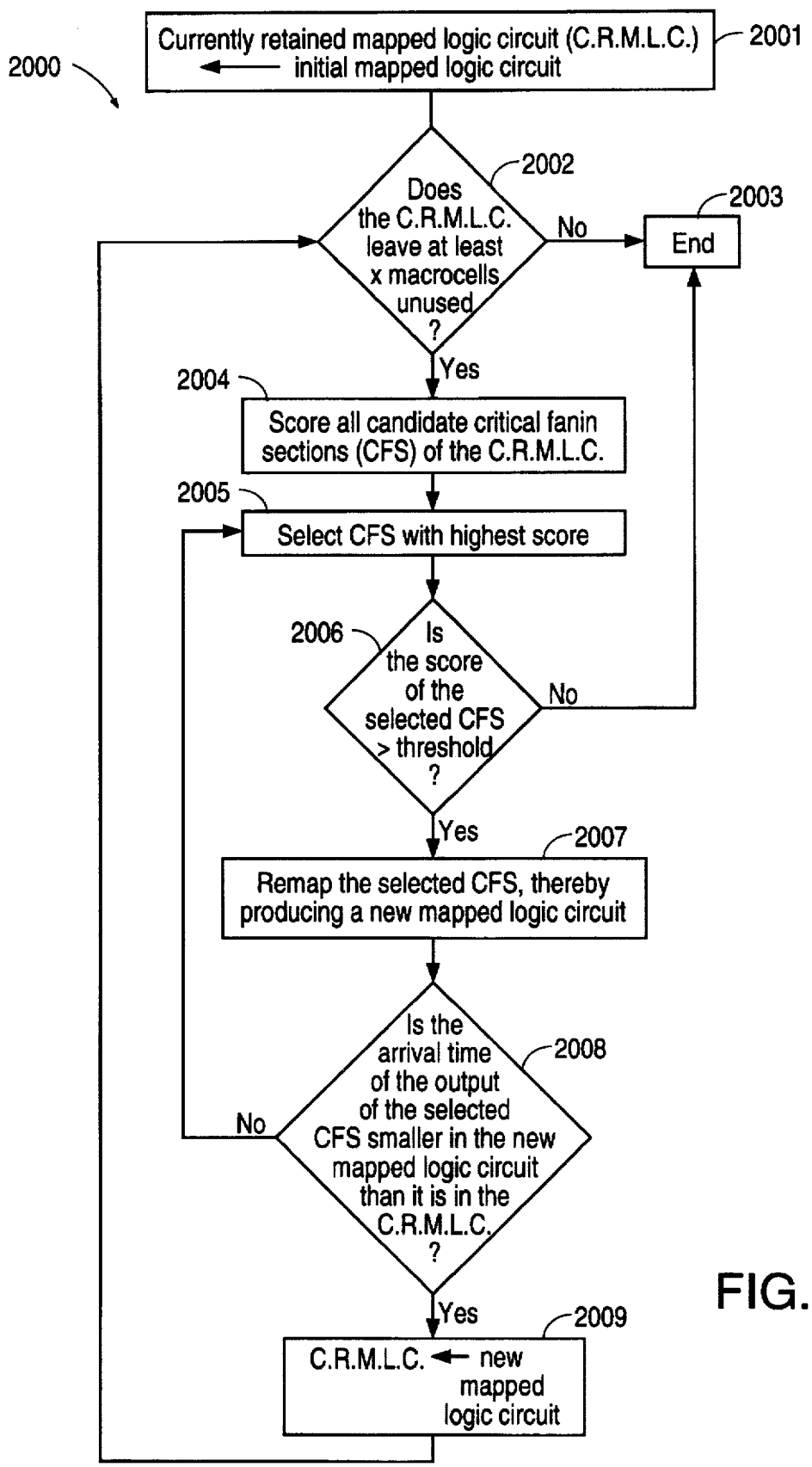
FIG. 2 is a simplified flowchart of one embodiment in accordance with the present invention.

FIG. 2 is a simplified flowchart 2000 in accordance with a specific embodiment of the present invention. In step 2001, an initial mapped logic circuit in which a reduction in critical path delay is desired is designated the "currently retained mapped logic circuit" (C.R.M.L.C.). The use, herein, of the expression "reducing critical path delay in a mapped logic circuit" refers to the generation of a second equivalent mapped logic circuit having a smaller critical path delay. The initial mapped logic circuit occupies a given number of the macrocells of the FPGA and leaves a given number of macrocells unused. It is to be understood that the logic circuit is not necessarily physically realized in hardware on the FPGA at this point in the method but rather a mapping exists of how the logic circuit could be implemented on the FPGA.

At step 2002, a determination is made whether there are at least a predetermined number x (in one embodiment, four) unused macrocells on the FPGA realizing the "currently retained mapped logic circuit" (the first time step 2002 is executed, the initial mapped logic circuit is the "currently retained mapped logic circuit"). Step 2007, discussed below, may require the availability of several unused macrocells to remap the currently retained logic circuit. For this reason, if there are not at least the predetermined number x of unused macrocells, then no further reduction in critical path delay in the currently retained mapped logic circuit is attempted and processing according to flowchart 2000 terminates.

In step 2004, various portions (each portion having one output net) called "critical fanin sections" (CFS) of the currently retained mapped logic circuit are identified as possible candidates for remapping and are "scored". More details regarding what a critical fanin section is and how critical fanin sections are scored, in one embodiment, are provided below. In order to "score" the candidate critical fanin sections of a mapped logic circuit, an "arrival time" associated with each net in the mapped logic circuit is determined. The arrival time of a particular net in a mapped logic circuit is the maximum of the respective propagation delays from "start points" of the logic circuit to the particular net, where a start point is an input net coupled to an input pad or a net coupled to an output lead of a flip-flop. For example, in the mapped logic circuit of FIG. 3, nets bp, cp, ep, hp, i and jp are "start points".

Next, in step 2005, the critical fanin section with the highest score in the currently retained mapped logic circuit is selected for remapping.

Next, in step 2006, the score of the critical fanin section selected in step 2005 is compared against a threshold. A low score may signify that the potential for reduction of propagation delay is minimal. For this reason, if the score is not greater than the threshold, then processing transfers from decision step 2006 to step 2003 and processing according to flowchart 2000 terminates. If, on the other hand, the score is greater than threshold, then processing transfers from decision step 2006 to step 2007.

In step 2007, the critical fanin section selected in step 2005 is remapped using "select sets" and a "new mapped logic circuit" is thereby generated. (The use herein of the expression "remapping of a CFS" indicates generating another mapping of the logic function corresponding to the output net of the critical fanin section.) What select sets are and how select sets are used to remap a critical fanin section is described in further detail below.

Next, in step 2008, the arrival time of the output net of the selected critical fanin section in the "new mapped logic circuit" is compared with the arrival time of the output net of the selected critical fanin section in the currently retained mapped logic circuit. (The arrival time in the currently retained mapped logic circuit of the output net of the selected critical fanin section was already determined in order to score in step 2004.) Arrival times for the nets in the "new mapped logic circuit" must be determined in order to obtain the arrival time in the "new mapped logic circuit" of the output net of the selected critical fanin section, which is required for the comparison of step 2008.

Figure 3:
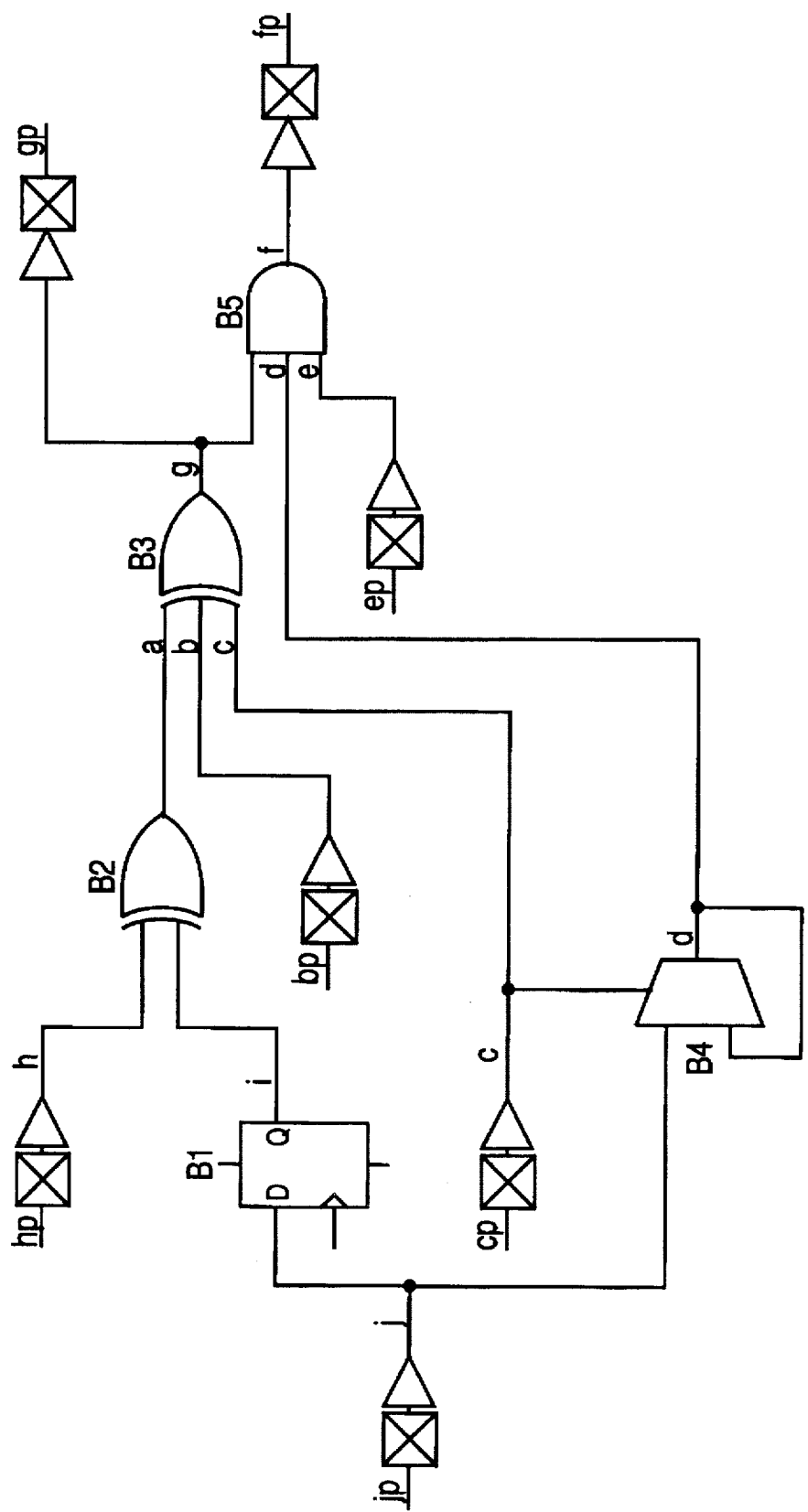
FIG. 3 depicts a sample mapped logic circuit to which the technique of the present invention is applied.

If it is determined in step 2008 that the arrival time of the output net of the selected critical fanin section in the new mapped logic circuit is smaller, then the maximum delay of all paths from any "start point" to any "stop point" which pass through the output net of the selected critical fanin section was reduced as a result of the remapping performed in step 2007. "Stop points" are the output nets coupled to output pads and the nets coupled to the output leads of flip-flops. In FIG. 3, the "stop points" are nets fp, gp and i. Thus, if the arrival time of the output net of the selected critical fanin section in the new mapped logic circuit is smaller, then the new mapped logic circuit produced in step 2007 is retained and processing transfers from decision step 2008 to step 2009. In step 2009, the currently retained mapped logic circuit becomes the new mapped logic circuit produced in step 2007. Processing transfers from step 2009 to decision step 2002, described above. Steps 2002–2006 (and possibly steps 2007–2008, depending on the outcome of decision step 2006) will be performed on the newly designated currently retained mapped logic circuit.

If, on the other hand, it is determined in step 2008 that the arrival time of the output net of the selected critical fanin section in the new mapped logic circuit is not smaller, then the maximum delay of all paths from any start point to any stop point which pass through the output net of the selected critical fanin section was not reduced as a result of the remapping performed in step 2007. The new mapped logic circuit produced in step 2007 is therefore not retained. Processing transfers from decision step 2008 to 2005 without changing the currently retained mapped logic circuit. In step 2005, another critical fanin section of maximum score (which has not yet been remapped) in the currently retained mapped logic circuit is selected for remapping. Steps 2006–2008, as described above, are then repeated for the newly selected (in step 2005) critical fanin section.

EXAMPLE

Figure 3A:
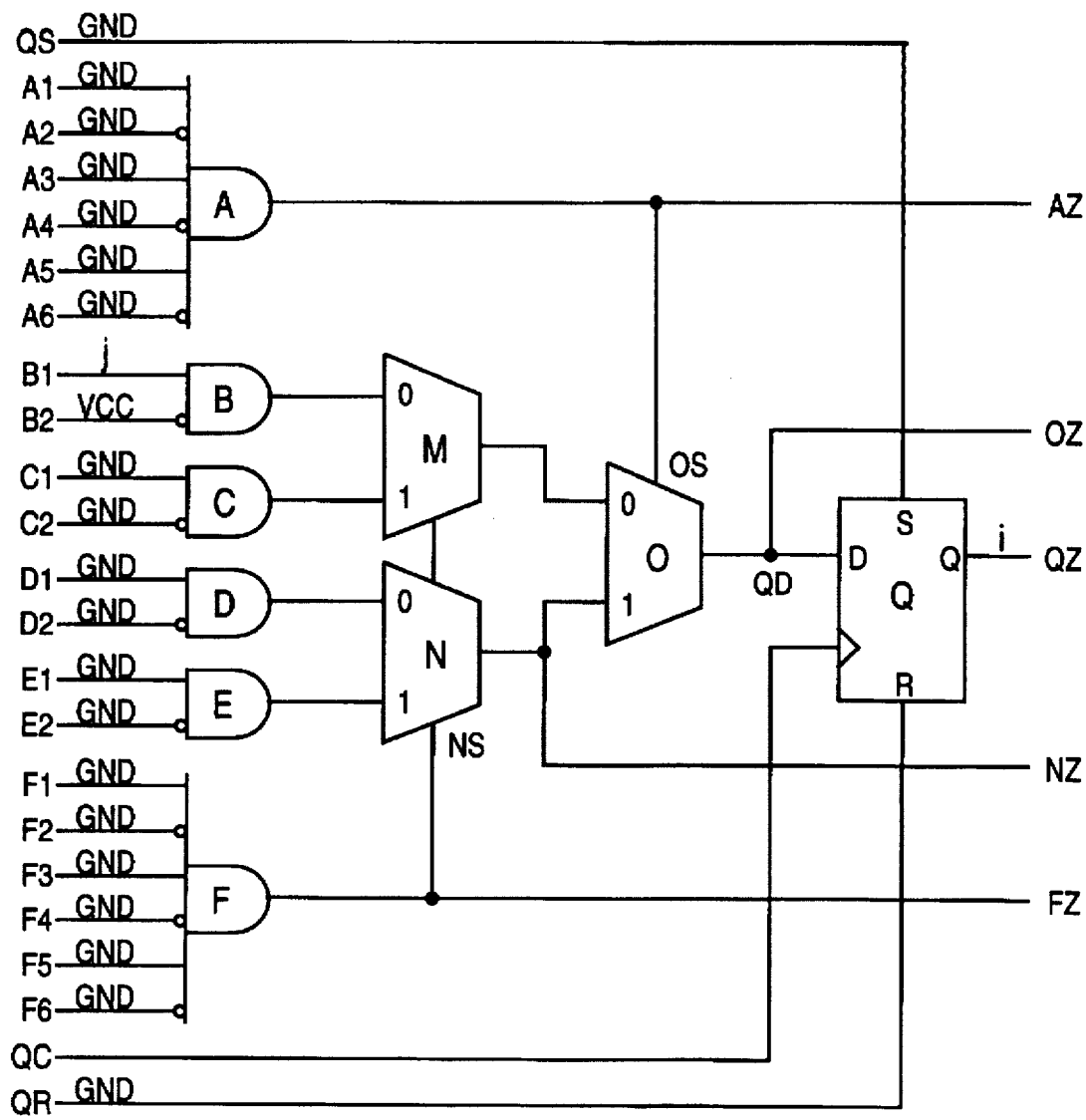
FIGS. 3A–3E depict macrocell implementations for respective blocks of the logic circuit of FIG. 3.
Figure 3B:
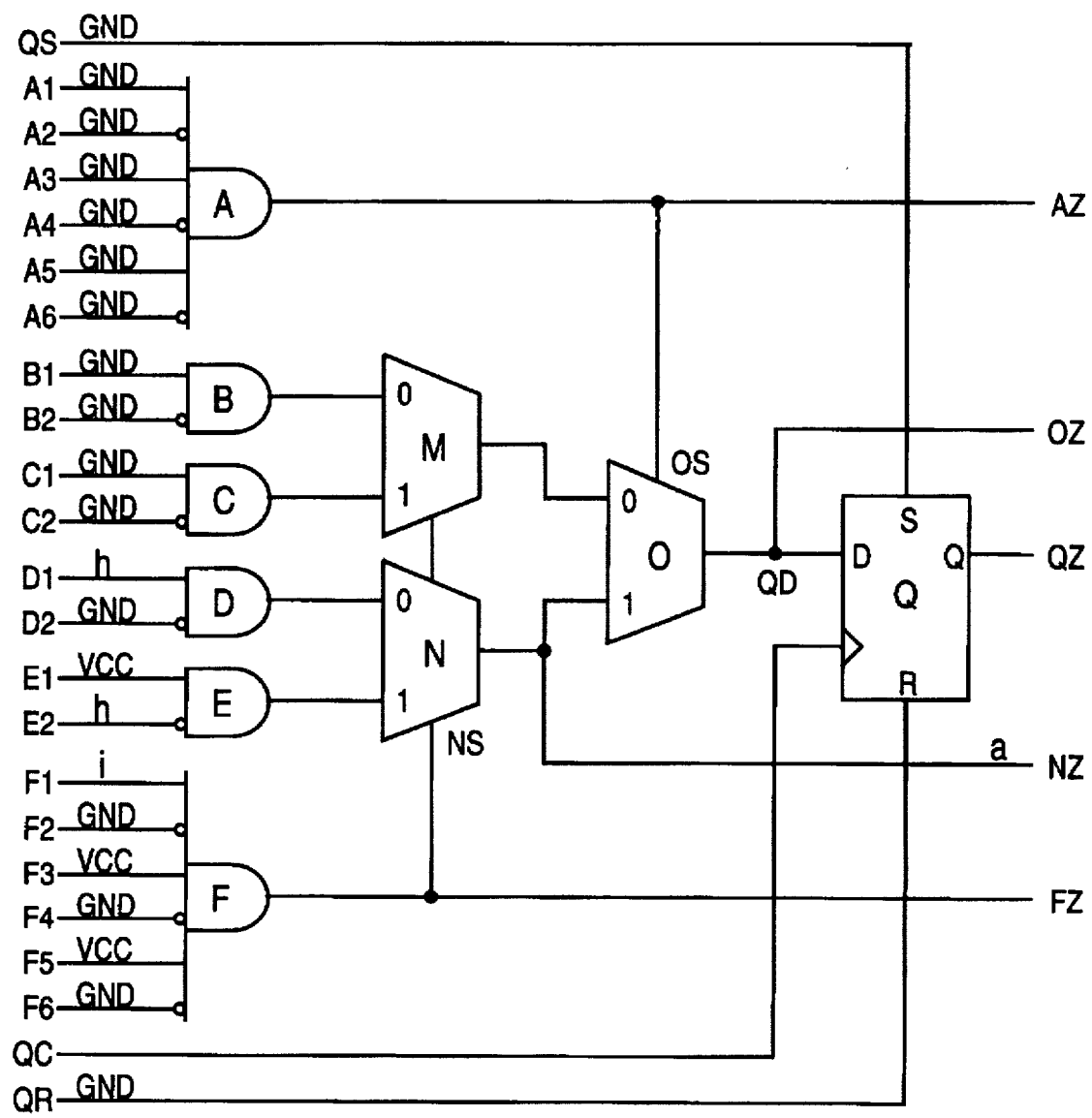
Figure 3C:
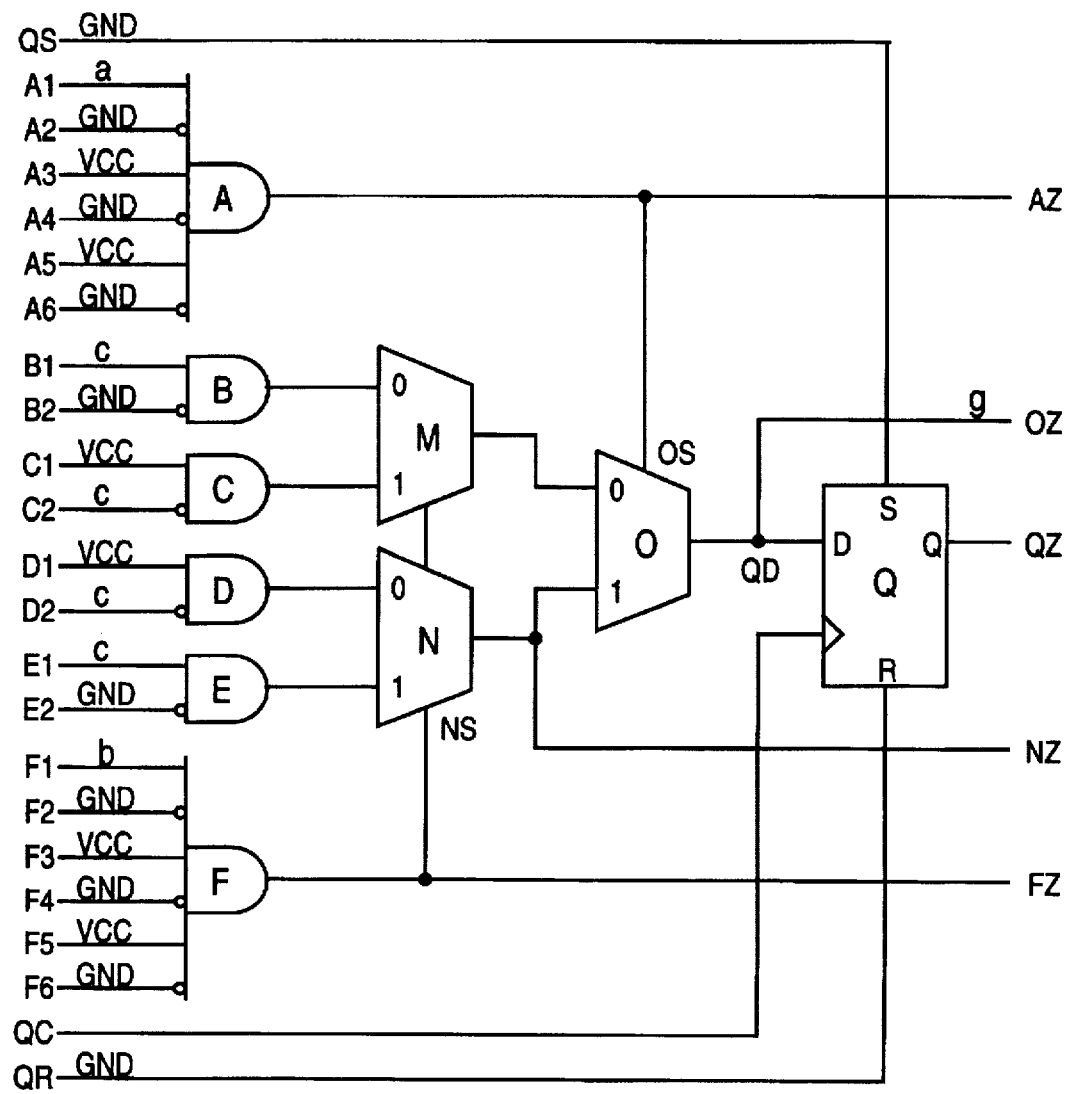
Figure 3D:
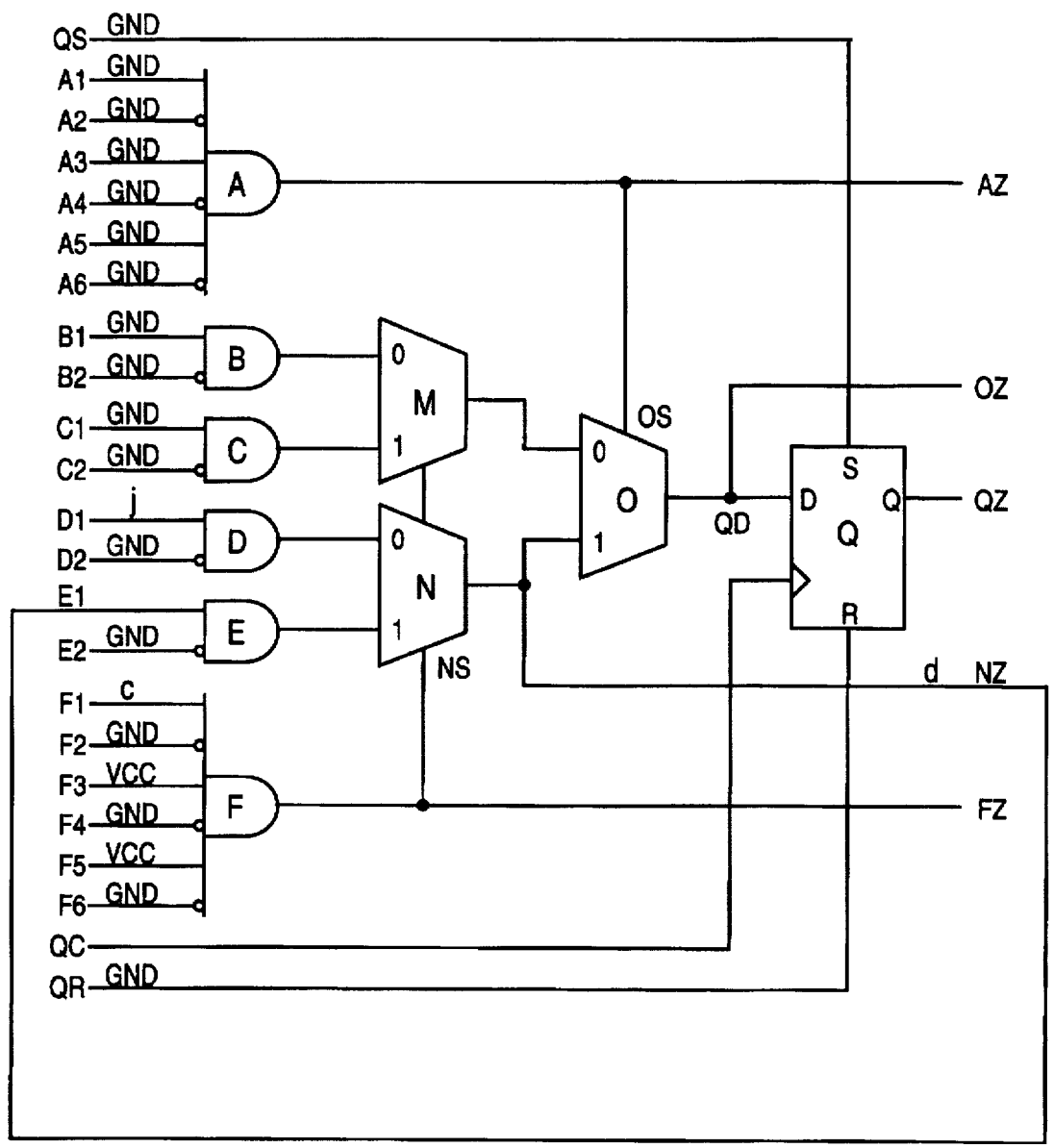
Figure 3E:
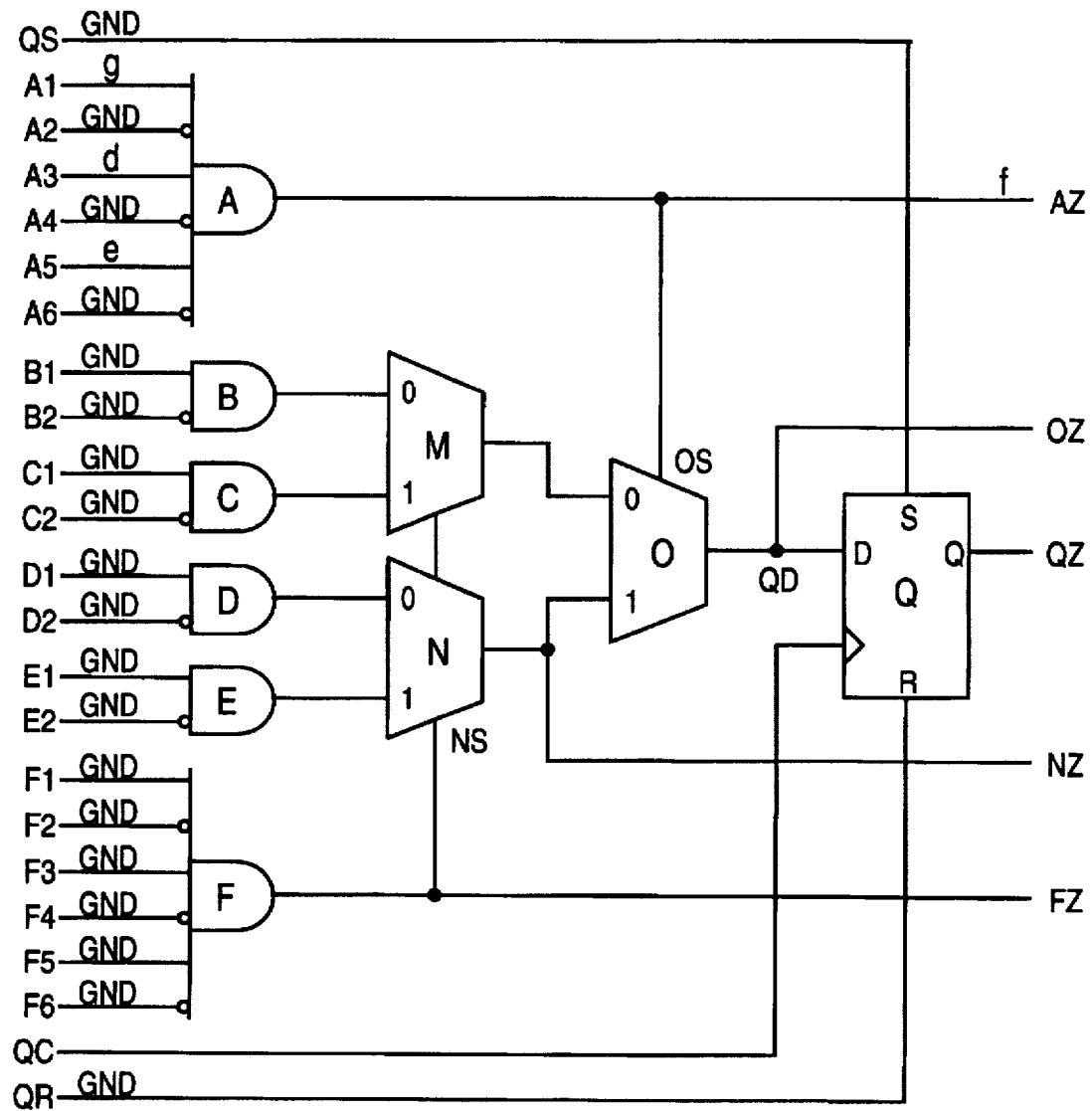

FIG. 3 shows a sample mapped logic circuit on which the method of the present invention is demonstrated. The mapped logic circuit includes input nets bp, cp, ep, hp and jp, output nets fp, gp, and various blocks of combinational and sequential logic numbered B1–B5. A block is a portion of combinational and/or sequential logic which is implemented in a macrocell. For example, D-flip-flop B1 is mapped into one macrocell as shown in FIG. 3A, two-input exclusive OR gate B2 is mapped into another macrocell as shown in FIG. 3B, three-input exclusive OR gate B3 is mapped into another macrocell as shown in FIG. 3C, multiplexer B4 is mapped into another macrocell as shown in FIG. 3D, and AND gate B5 is mapped into another macrocell as shown in FIG. 3E. (Although not illustrated by the sample mapped logic circuit of FIG. 3, in other mapped logic circuits it is possible for two blocks to be mapped to the same macrocell.)

FIGS. 4–18 (and accompanying text and tables) illustrate in detail processing performed in steps 2004–2009 of flowchart 2000 (FIG. 2) for the specific mapped logic circuit of FIG. 3.

Calculation Of Arrival/Departure Times

Arrival times and departure times are used in order to perform step 2004 of FIG. 2 (i.e. to "score" portions of a mapped logic circuit which are candidates for remapping). The calculation of arrival and departure times is therefore discussed below.

Figure 4:
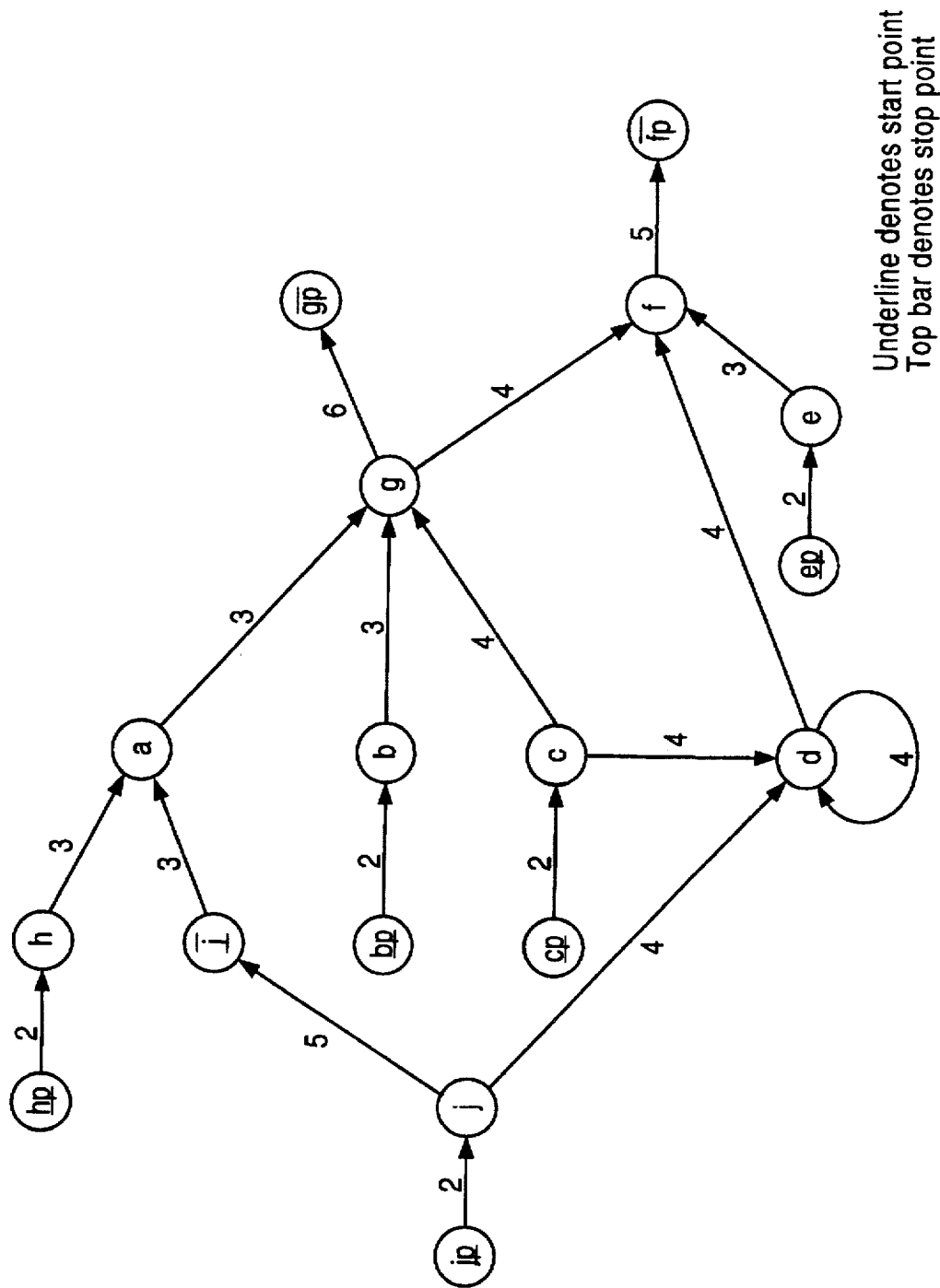
FIG. 4 depicts a net graph corresponding to the mapped logic circuit of FIG. 3.

FIG. 4 depicts a graph, known as a net graph, that corresponds to the mapped logic circuit of FIG. 3. An initial step in the computation of arrival and departure times in a mapped logic circuit involves the construction of a net graph corresponding to the mapped logic circuit. Each node in the net graph corresponds to a net in the mapped logic circuit. Given that the logic circuit of FIG. 3 contains nets a, b, c, d, e, f, g, h, i, j, bp, cp, ep, fp, gp and jp, the net graph of FIG. 4 contains nodes a, b, c, d, e, f, g, h, i, j, bp, cp, ep, fp, gp and jp.

Each arrow in FIG. 4 is referred to, herein, as a "directed edge". There is a directed edge between two nodes of the net graph of FIG. 4 if the two nets in FIG. 3 corresponding to the two nodes are an input net and an output net, respectively, of either an input pad, an output pad, or one of the blocks of logic, B1–B5.

Thus, for example, there is a directed edge from node h to node a in the net graph of FIG. 4 because, in the mapped logic circuit of FIG. 3, net h is an input net to a block of logic (B2) and net a is the output net of that block. There is also a directed edge from node jp to node j in the net graph of FIG. 4 because, in the mapped logic circuit of FIG. 3, net jp is an input net to an input pad and net j is the output net of that input pad. Similarly, there is a directed edge from node f to node fp in the net graph of FIG. 4 because, in the mapped logic circuit of FIG. 3, net f is an input net to an output pad and net fp is the output net of that output pad.

Each directed edge in the net graph of FIG. 4 is labelled with a delay. The delay labelling the edge from node g to node f represents a signal propagation delay from the driver of node g (i.e. the output of block B3 in FIG. 3) to the driver of net f (i.e. the output of block B5 in FIG. 3). The delay on the directed edge from node g to node f is computed in one embodiment to be the sum of two factors.

The first factor equals the fanout (i.e. number of destinations) of net g in the mapped logic circuit of FIG. 3. Net g has two destinations and therefore has a fanout of 2. The second factor is a delay through the combinational logic block B5 separating nets g and f in FIG. 3. The delay through any of the combinational blocks of FIG. 3 is assumed to be 2. Thus, the delay on the directed edge from node g to node f is equal to 2+2=4.

The delays marked on the other directed edges in FIG. 4 are computed in an analogous manner. For this purpose, the delays through input pads, output pads, sequential block B1, and combinational logic blocks, B2–B5, are 2, 4, 3 and 2, respectively. It is to be understood, however, that the delays of the combinational logic blocks in a circuit may differ and would typically not all be the same as in this example.

The technique discussed below, for determining arrival and departure times for the nets of FIG. 3, requires knowledge of which nodes in the net graph of FIG. 4 correspond to start points and stop points in FIG. 3, respectively. Nodes in the net graph of FIG. 4 that correspond to start points and stop points in FIG. 3, respectively, are hereinafter referred to as "start nodes" and "stop nodes", respectively. As indicated above, in FIG. 3 the "start points" are nets bp, cp, ep, hp, i and jp and the "stop points" are nets fp, gp and i. The corresponding start and stop nodes of FIG. 4 are indicated by underlining and overlining, respectively.

In addition to the start and stop nodes described above, it may be necessary to mark certain nodes in the net graph as both start and stop nodes in order to "break loops" in the net graph. Without breaking loops in the net graph by labelling one node in the loop as both a start node and a stop node, the method of calculating arrival and departure times presented below could fall into infinite recursion. The net graph of FIG. 4 has one loop, i.e. from node d to node d. (Other net graphs could have larger loops involving more than one node. For example, if there were directed edges from node a to node b, from node b to node c, and from node c to node a, nodes a, b and c would constitute a loop.)

One technique for breaking loops, as applied to the net graph of FIG. 4, is as follows: A depth-first traversal from each stop node of the net graph (i.e. fp, gp and i) is performed traversing backwards through the net graph in the direction opposite to that of the edges (i.e. "upstream" direction) and stopping at start nodes. The order in which the traversals are performed is immaterial. As an example, a depth-first traversal starting from stop node fp is performed first.

From stop node fp, node f is reached (via the f to fp directed edge). Node f (like all the other nodes of the net graph in FIG. 4) has two flags, a "marked" flag and a "visited" flag. (At the start of the loop breaking technique, the "marked" and "visited" flags for each node of the net graph are reset, i.e. assigned the value "false".) Upon reaching node f, both the "marked" and "visited" flags for node f are set (i.e. assigned the value "true").

Given that there are three directed edges terminating at node f (i.e. from nodes e, d and g), the depth first traversal may proceed in any of three directions. For concreteness, node e will be reached next from node f (via the e to f directed edge). Upon reaching node e, both the "marked" and "visited" flags for node e are set (i.e. assigned the value "true").

From node e, node ep is reached (via the ep to e directed edge). Since node ep is a start node, the traversal returns from node ep to node e (from which node ep was reached). Given that there is no directed edge terminating at node e that has not already been traversed, the traversal returns from node e to node f (from which node e was reached) and the "marked" flag of node e is reset.

There are two directed edges terminating at node f that have not yet been traversed (i.e. from nodes d and g). Thus, the traversal can proceed in either of two directions. In this example, node d will be reached next from node f (via the d to f directed edge). Upon reaching node d, both the "marked" and "visited" flags for node d are set.

There are three directed edges terminating at node d that have not yet been traversed (i.e. from nodes d, c and j). Thus, the traversal can proceed in either of three directions. In this example, node d will be reached next from node d (via the d to d directed edge). Upon reaching node d, node d is made both a start node and a stop node because a node (i.e. node d) whose "marked" flag is set has been reached. Since node d is now a stop point, a depth-first traversal starting from node d will be performed in addition to the depth-first traversals starting from each of the original stop points in the net graph of FIG. 3 (i.e. nodes fp, gp and i).

The marking of node d as both a start node and a stop node prevents the occurrence of infinite recursion (that might otherwise occur on account of the loop in the net graph from node d to itself) during the performance of the techniques (disclosed below) for calculating arrival and departure times, respectively, because the traversals of the net graph in the former (latter) technique stop at start (stop) nodes.

Given that node d is now a start node, the traversal returns from node d to node f (from which node d was reached). From node f, node g is reached via the g to f directed edge. The g to f directed edge is the only directed edge terminating at f that has not yet been traversed. Upon reaching node g, both the "marked" and "visited" flags for node g are set. The remainder of the depth-first traversal that began at stop node fp proceeds in a similar fashion to the above-described traversals.

Following the above-described traversal from stop node fp, a depth-first traversal starting from stop node gp is performed. Node g is reached from node gp, via the only edge terminating at node gp (i.e. the g to gp directed edge). However, because the "visited" flag of node g is already set (indicating that the portion of the net graph that is upstream from node g has already been traversed during the traversal that began from stop node fp) the traversal returns from node g to node gp.

Table 1 illustrates all depth-first traversals starting from each of the stop nodes (i.e. nodes fp, gp, and i), respectively, that are performed in order to break loops in the net graph of FIG. 4.

TABLE 1

| Node Visited | Action Taken |
| --- | --- |
| fp (stop node) | Start a depth-first traversal from stop node fp |
| f | Set "marked" and "visited" flags of f |
| e | Set "marked" and "visited" flags of e |
| ep (start node) | Return |
| e | Return and reset "marked" flag of e |
| f | |
| d | Set "marked" and "visited" flags of d |
| d (start node) | Make d a start node and a stop node and return |
| f | |
| g | Set "marked" and "visited" flags of g |
| c | Set "marked" and "visited" flags of c |
| cp (start node) | Return |
| c | Return and reset "marked" flag of c |
| g | |
| b | Set "marked" and "visited" flags of b |
| bp (start node) | Return |
| b | Return and reset "marked" flag of b |
| g | |

TABLE 1-continued

| Node Visited | Action Taken |
| --- | --- |
| a | Set "marked" and "visited" flags of a |
| h | Set "marked" and "visited" flags of h |
| hp (start node) | Return |
| h | Return and reset "marked" flag of h |
| a | |
| i (start node) | Return |
| a | Return and reset "marked" flag of a |
| g | Return and reset "marked" flag of g |
| f | Return and reset "marked" flag of f |
| fp | Depth-first traversal from stop node fp is complete |
| gp (stop node) | Start depth-first traversal from stop node gp |
| g | Return since g's "visited" flag is set |
| gp | Depth-first traversal from stop node gp complete |
| i (stop node) | Start depth-first traversal from stop node i |
| j | Set "marked" and "visited" flags of j |
| jp (start node) | Return |
| j | Return and reset "marked" flag of j |
| i | Depth-first traversal from stop node i complete |
| d | Start depth-first traversal from stop node d |
| c | Return since c's "visited" flag is set |
| d | |
| j | Return since j's "visited" flag is set |
| d | |
| d | Return since d is a start node |
| d | Depth-first traversal from stop node d is complete |

Figure 5:
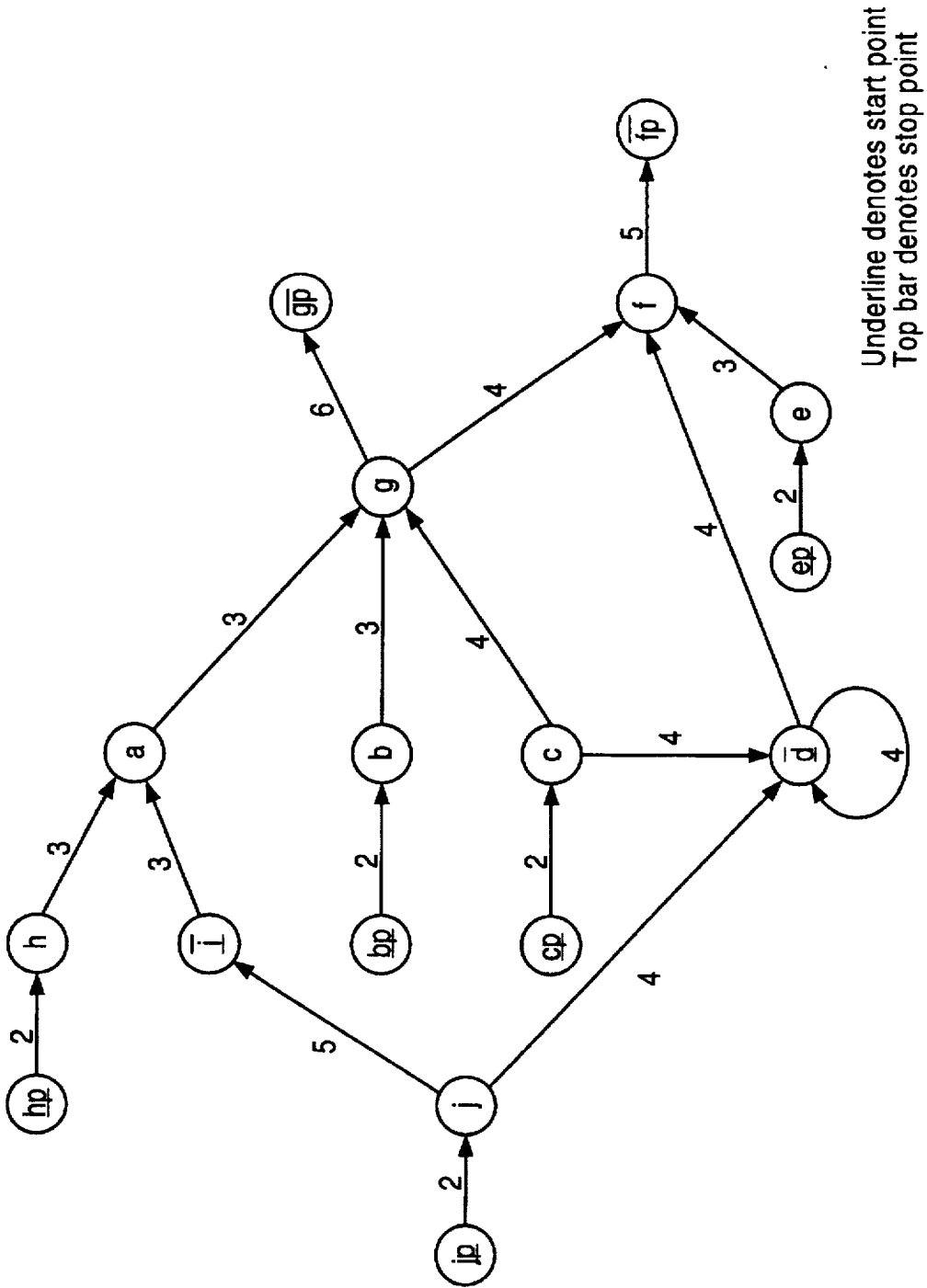
FIG. 5 depicts a net graph resulting from the application of a loop breaking technique to the net graph of FIG. 4.

Thus, as a result of applying the loop breaking technique to the net graph of FIG. 4, node d is marked as both a start node and a stop node, and the net graph of FIG. 5 is obtained. Given a net graph (FIG. 5), corresponding to the mapped logic circuit of FIG. 3, with delays marked on the directed edges and loops broken, the computation of arrival times for the nets of FIG. 3 proceeds.

Table 2 illustrates a technique for calculating arrival times, from the net graph of FIG. 5. There is an "arrival time" and a "visited" flag associated with each node of the net graph of FIG. 5. The arrival time associated with a node X, where X is a variable representing one of the nodes of FIG. 5, is denoted by AT(X). For example, the arrival time associated with node b of FIG. 5 is denoted AT(b). Initially, the visited flag and arrival time associated with each node in the net graph are reset by assigning the visited flag the value "false" and setting the arrival time to 0.

Next, a depth-first traversal of the net graph of FIG. 5 from each stop node, traversing backwards through the net graph in the direction opposite to that of the edges (i.e. "upstream" direction), and stopping at start nodes, is performed. Whenever a node whose "visited" flag is not set (i.e. has the value "false") is reached during the technique of Table 2, then the "visited" flag of the node is set (i.e. changed to "true"). Whenever a node whose "visited" flag is set is reached, the traversal immediately returns from that node because the portion of the net graph that is upstream from the node has already been traversed. Whenever returning from a node X to a node Y (where nodes X and Y are variables denoting two nodes of the net graph of FIG. 5), AT(Y) is set to the greater of AT(Y) and (AT(X)+delay (X,Y)), unless X is a start node in which case AT(Y) is set to the greater of AT(Y) and delay (X,Y). Delay (X,Y) denotes the delay associated with the directed edge from X to Y in the net graph. Table 2 illustrates the application of the above technique for calculating arrival times to the net graph of FIG. 5, and lists nodes visited and corresponding actions taken.

TABLE 2

| Node Visited | Action Taken |
| --- | --- |
| fp | Start a depth-first traversal from stop node fp |
| f | Set "visited" flag of f |
| e | Set "visited" flag of e |
| ep (start node) | Return to e; AT(e) ← max (AT(e), delay (ep,e)) = max (0,0+2) = 2 |
| e | Return to f; AT(f) ← max (AT(f), AT(e) + delay (e,f)) = max (0,2+3) = 5 |
| f | |
| d (start node) | Return to f; at AT(f) ← max (AT(f), delay (d,f)) = max (5,4) = 5 |
| f | |
| g | Set "visited" flag of g |
| c | Set "visited" flag of c |
| cp (start node) | Return to c; AT(c) ← max (AT(c), delay (cp,c)) = max (0,2) = 2 |
| c | Return to g; AT(g) ← max (AT(g), AT(c) + delay (c,g)) = max (0,2+4) = 6 |
| g | |
| b | Set "visited" flag of b |
| bp (start node) | Return to b; AT(b) ← max (AT(b), delay (a,b)) = max (0,2) = 2 |
| b | Return to g; AT(g) ← max (AT(g), AT(b) + delay (b,g)) = max (6,2+3) = 6 |
| g | |
| a | Set "visited" flag of a |
| h | Set "visited" flag of h |
| hp (start node) | Return to h; AT(h) ← max (AT(h), delay (hp,h)) = max (0,2) = 2 |
| h | Return to a; AT(a) ← max (AT(a), AT(h) + delay (h,a)) = max (0,2+3) = 5 |
| a | |
| i (start node) | Return to a; AT(a) ← max (AT(a), delay (i,a)) = max (5,3) = 5 |
| a | Return to g; AT(g) ← max (AT(g), AT(a) + delay (a,g)) = max (6,5+3) = 8 |
| g | Return to f; AT(f) ← max (AT(f), AT(g) + delay (g,f)) = max (5,8+4) = 12 |
| f | Return to fp; AT(fp) ← max (AT(fp), AT(f) + delay (f,fp)) = max (0,12+5) = 17 |
| fp | Depth-first traversal from stop node fp completed |
| gp | Start traversal from stop node gp |
| g | Return to gp (because g's "visited" flag set); AT(gp) ← max (AT(gp), AT(g) + delay (g,gp)) = max (0,8+6) = 14 |
| gp | Depth-first traversal from stop node gp completed |
| i | Start traversal from stop node i |
| j | Set "visited" flag of j |
| jp (start node) | Return to j; j ← max (AT(j), delay (jp,j)) = max (0,2) = 2 |
| j | Return to i; i ← max AT(i), AT(j) + delay (j,i)) = max (0,2+5) = 7 |
| i | Depth-first traversal from stop node i completed |
| d | Start traversal from stop node d |
| c | Return to d (because c's "visited" flag is set); AT(d) ← max (AT(d), AT(c) + delay (c,d)) = max (0,2+4) = 6 |
| d | |

TABLE 2-continued

| Node Visited | Action Taken |
| --- | --- |
| j | Return to d (because j's "visited" flag is set); AT(d) ← max (AT(d), AT(j) + delay (j,d)) = max (6,2+4) = 6 |
| d | |
| d (start node) | Return to d; AT(d) ← max (AT(d), delay (d)) = max (6,4) = 6 |
| d | Depth-first traversal from stop node d complete |

The departure times associated with the nets of FIG. 5 (which are, in addition to the arrival times, required for the scoring of critical fanin sections being considered for remapping in step 2004 of FIG. 2) are computed by a technique analogous to that of Table 2. For every node in the net graph of FIG. 5, there is a "visited" flag and d "departure time." The departure time associated with node (X), where X is a variable denoting one of the nodes of FIG. 5, is denoted by DT(X). At the start of the technique for computing departure times, the visited flag for each node is reset and the departure time for each node is set to zero. Next, a depth-first traversal of the net graph of FIG. 5 is performed from each start point traversing forwards through the net graph in the direction of the edges (i.e. "downstream" direction) and stopping at stop points. When a node is reached, it is immediately returned from if its visited flag is set. If the node's visited flag is not already set when the node is reached, then the node's visited flag is set. When returning from a node A to a node B (where A and B are variables representing two of the nodes of FIG. 5), DT(B) is set to the greater of DT(B) and (DT(A)+delay (B,A)) unless A is a stop node in which case DT(B) is set to the greater of DT(B) and delay (B,A).

Figure 6:
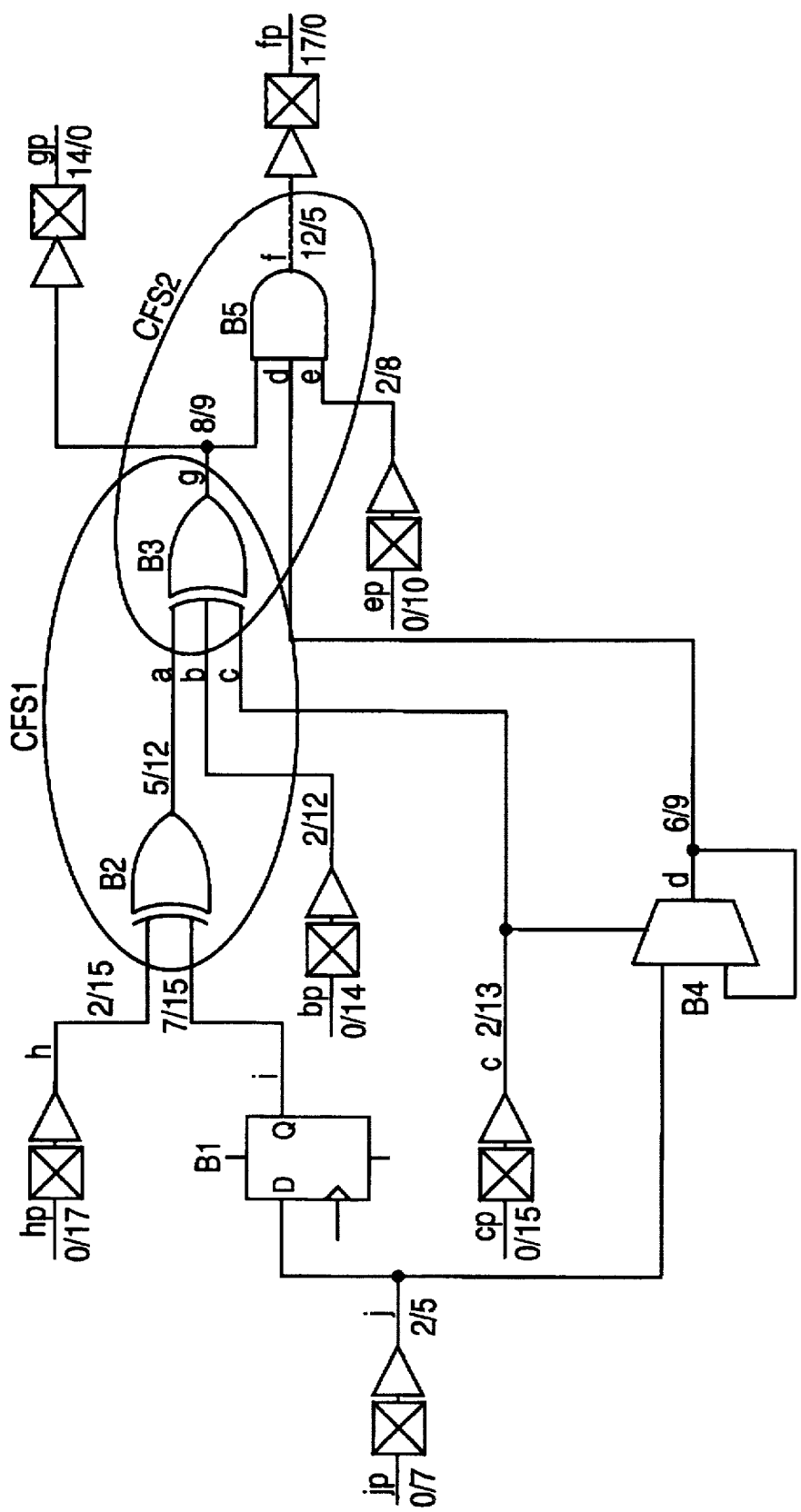
FIG. 6 depicts the mapped logic circuit of FIG. 3 with arrival and departure times and candidate critical fanin sections indicated.

FIG. 6 illustrates the mapped logic circuit of FIG. 3 with the arrival and departure time for each net indicated beside the net. The numbers before and after the "/" indicate the arrival time and departure time, respectively. The arrival times were determined as shown above in Table 2 and the departure times were calculated by an analogous method as discussed above.

Given a mapped logic circuit with arrival and departure times computed for each net (FIG. 6), various portions of the mapped logic circuit of FIG. 6, (called critical fanin sections) are scored. In this example, each candidate critical fanin section consists of two combinational blocks in the mapped logic circuit, the output of the first block providing an input to the second block, wherein the net between the first and second blocks is not a start/stop point. This latter condition implies that combinational blocks B4 and B5 do not constitute a critical fanin section because the net between blocks B4 and B5 (net d) is a start/stop point (as identified in FIG. 5 and Table 1).

For the mapped logic circuit of FIG. 6 there are two candidate critical fanin sections, both of which are encircled. One such candidate critical fanin section, denoted CFS1, consists of blocks B2 and B3. The other candidate critical fanin section, denoted CFS2, consists of the blocks B3 and B5. The logic functions corresponding to the output nets of CFS1 and CFS2 are g=(h⊕i)⊕b⊕c and f=(a⊕b⊕c)de, respectively. If CFS1 is selected for remapping, then the logic function g will be remapped onto one or more macrocells. Similarly, if CFS2 is selected for remapping, then the logic function f will be remapped onto one or more macrocells. (Any reference herein to the logic function corresponding to a critical fanin section indicates the logic function corresponding to the output net of the critical fanin section.) The critical fanin section having the higher "score" is selected for remapping. See step 2005 of FIG. 2. The remapping of the selected critical fanin section results in a new mapped logic circuit.

The "score" of CFS1 (consisting of blocks B2 and B3) is computed as the sum of the maximum delay of a path in the mapped logic circuit of FIG. 6, from a start point to a stop point, through the output net of CFS1 (i.e. net g) plus the difference between the maximum arrival time of an input net to B2 (i.e. nets h and i) and the minimum arrival time of an input net to B3 not including the output net of B2 (i.e. nets b and c). The maximum delay of a path from a start point to a stop point through a given net is equal to the sum of the arrival and departure times for that net. (For the purposes of CFS scoring, the value of the arrival time of a node X is AT[X] as computed above in Table 2, unless X is a start point in which case the value zero is used, where X is a variable representing one of the nets of FIG. 6.)

Thus, the score for CFS1 equals the arrival time of net g+the departure time of net g+[max(arrival time of net h, arrival time of start point i)−min (arrival time of net b, arrival time of net c)]=AT[g]+DT[g]+[max (AT[h], 0)−min (AT[b], AT[c])]=8+9+[max (2,0)−min (2,2)]=17.

Similarly, the score for CFS2 equals the arrival time of net f+the departure time of net f+[max(arrival time of net a, arrival time of net b, arrival time of net c)−min (arrival time of start point d, arrival time of net e)]=AT[f]+DT[f]+[max (AT[a], AT[b], AT[c])−min (0, AT[e])]=12+5+[max (5,2,2) −min (0,2)]=22.

Given that CFS2 has a higher score than CFS1, CFS2 is selected for remapping in step 2005. Assuming that the score of the selected critical fanin section CFS2 exceeds a predetermined threshold (step 2006 of FIG. 2), CFS2 is remapped using selects sets (step 2007 of FIG. 2), as further described below.

Remapping The Selected Critical Fanin Section

In step 2007, the implementation onto one or more macrocells is obtained of the logic function corresponding to the selected critical fanin section. Here the function f=(a⊕b⊕c)de of CFS2 is remapped. The macrocell containing the output carrying net f is referred to below as macrocell 1. The remapping performed in step 2007 results in a "new" mapped logic circuit. If the arrival time of net f in the "new" mapped logic circuit is smaller than the arrival time of net f in the initial mapped logic circuit (i.e. that of FIG. 6), then the "new" mapped logic circuit is retained (step 2008 of FIG. 2). Otherwise, the "new" mapped logic circuit is discarded and the initial mapped logic circuit is retained.

Figure 7:
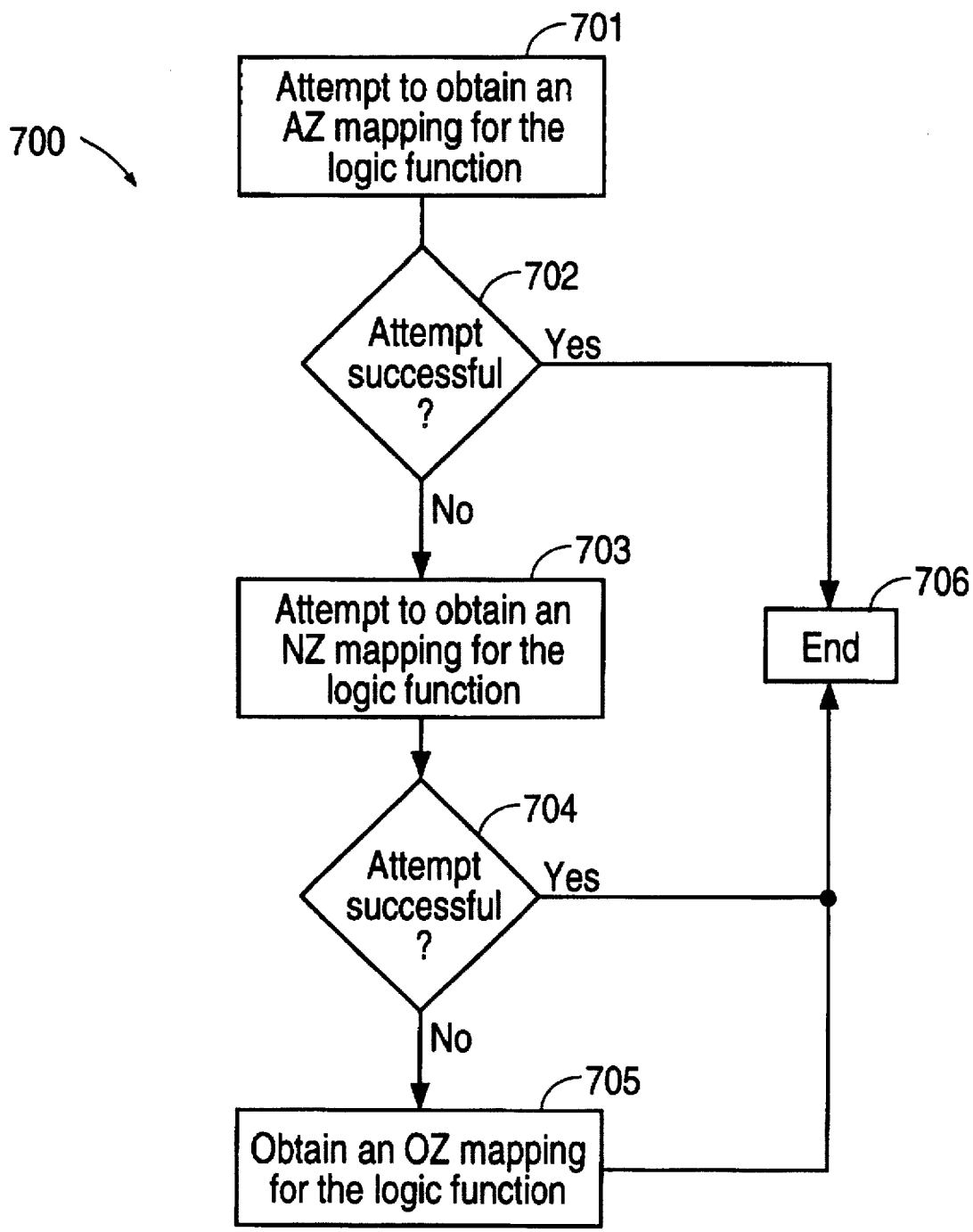
FIG. 7 is a simplified flowchart of one embodiment in accordance with the present invention.

FIG. 7 is a simplified flowchart 700, in accordance with one embodiment of the present invention, illustrating the mapping of a logic function of one or more nets onto one or more macrocells. In this example, the logic function corresponding to the selected critical fanin section CFS2 (i.e. f=(a⊕b⊕c)de=ade⊕bde⊕cde) is mapped.

Initially (step 701), an attempt is made to obtain a mapping (hereinafter referred to as an "AZ mapping") of the logic function corresponding to CFS2, using only one macrocell (macrocell 1), whereby net f is realized on the AZ output of macrocell 1. If the attempt to obtain an AZ mapping for the logic function corresponding to CFS2 fails, then an attempt is made (step 703) to obtain a mapping (hereinafter referred to as an "NZ mapping") using only one macrocell (macrocell 1), whereby net f is realized on the NZ output of macrocell 1. Finally, if the attempts to obtain AZ and NZ mappings fail, then the logic function is mapped (step 703) onto one or more macrocells (hereinafter referred to as an "OZ mapping"), whereby net f is realized on the OZ output of one of those macrocells (macrocell 1).

Attempting To Obtain An AZ Mapping

Figure 8:
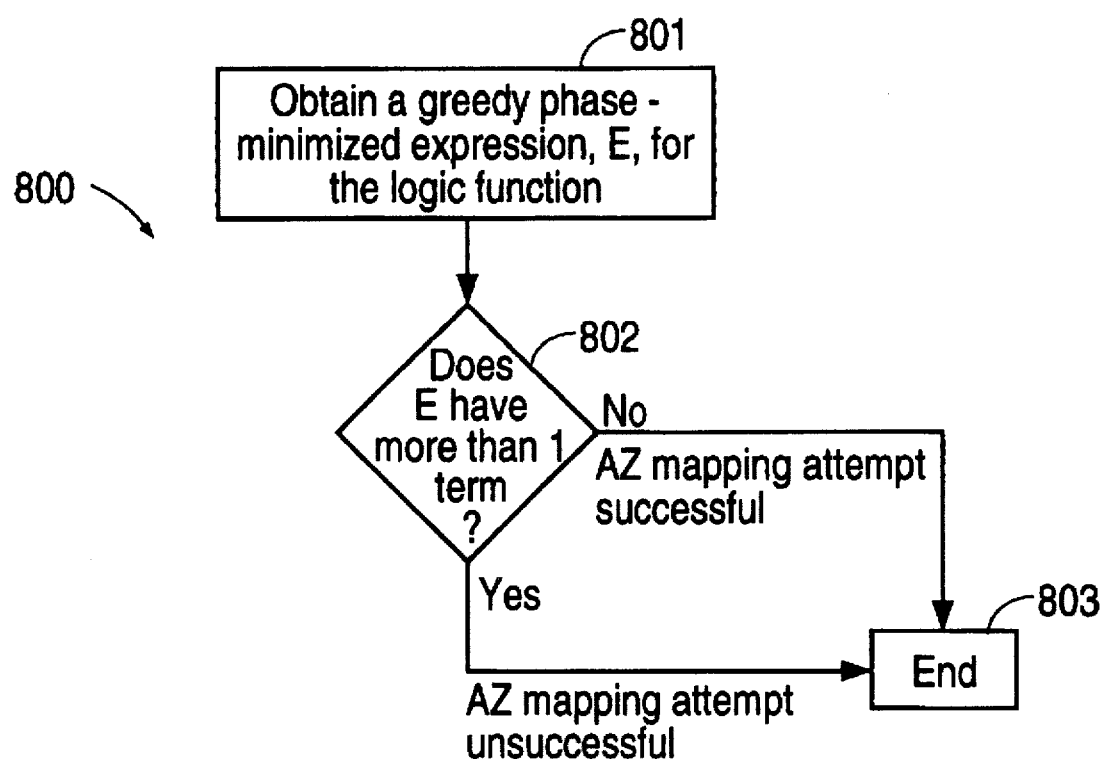
FIG. 8 is a simplified flowchart of one embodiment in accordance with the present invention.

FIG. 8 is a simplified flowchart 800, in accordance with one embodiment of the present invention, that illustrates step 701 of FIG. 7 in more detail and is used, herein, to determine whether or not an AZ mapping for the logic function corresponding to CFS2 (i.e. f=(a⊕b⊕c)de= ade⊕bde⊕cde) can be obtained.

In step 801, an expression in greedy phase-minimized Reed Muller form for the logic function corresponding to CFS2 is generated. A method for generating an expression in greedy phase-minimized Reed Muller form for a logic function is taught in application Ser. No. 08/231,595, entitled "Select Set-Based Technology Mapping Method and Apparatus", filed Apr. 21, 1994, the subject matter of which is incorporated herein by reference. The expression ade⊕bde⊕cde, for the logic function which corresponds to CFS2, is an expression in greedy phase-minimized Reed Muller form, as can be verified by applying the method referenced immediately above.

Given that the expression determined in step 801 has more than one term, the logic function corresponding to CFS2 cannot be expressed as the product of literals (where a literal is a net or the complement of a net) and hence the attempt to obtain an AZ mapping for the logic function fails (steps 802, 803). Thus, an attempt to obtain an NZ mapping for the logic function corresponding to CFS2 will be attempted next (step 703 of FIG. 7).

Attempting To Obtain An NZ Mapping

Figure 9:
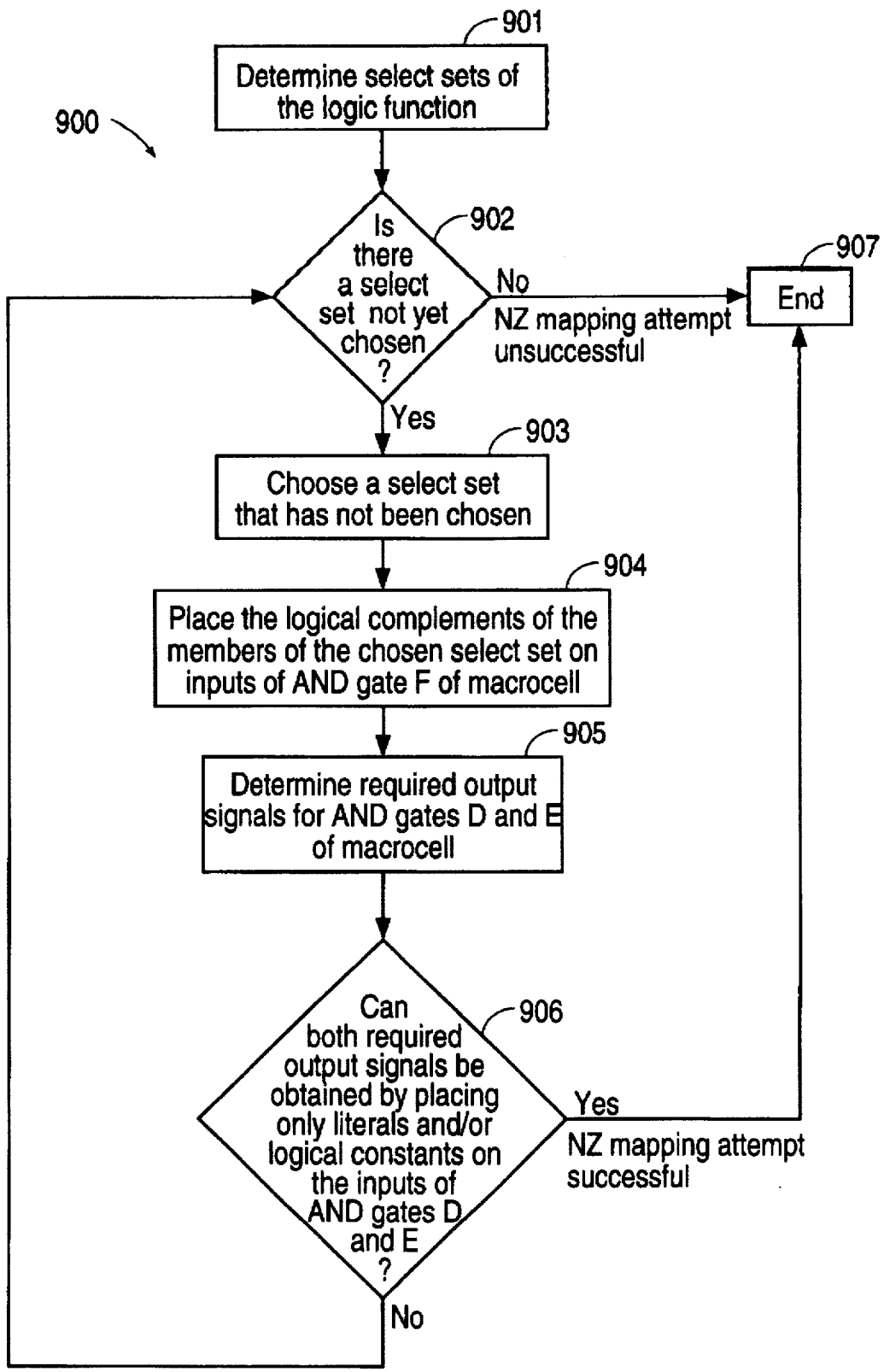
FIG. 9 is a simplified flowchart of one embodiment in accordance with the present invention.

FIG. 9 is a simplified flowchart 900, in accordance with one embodiment of the present invention, that illustrates step 703 of FIG. 7 in more detail and is used, herein, to determine whether or not an NZ mapping for the logic function corresponding to CFS2 (i.e. f=(a⊕b⊕c)de= ade⊕bde⊕cde) can be obtained.

An initial step (step 901) in the attempt to obtain an NZ mapping for the logic function corresponding to CFS2 involves the determination of one or more select sets of this logic function. Two possible methods for determining one or more select sets of a logic function are disclosed in application Ser. No. 08/231,595, entitled "Select Set-Based Technology Mapping Method and Apparatus", filed Apr. 21, 1994. The select sets for the logic function corresponding to CFS2 (i.e. f=(a⊕b⊕c)de=ade⊕bde⊕cde) are identified to be $\{\bar{d}, \bar{e}\}$, $\{a\}$, $\{\bar{b}\}$, and $\{\bar{c}\}$, given that the expression ads⊕bde⊕cde is in greedy phased-minimized Reed-Muller form (see discussion, regarding the determination of select sets of a logic function by generating for the function an expression in greedy phase-minimized Reed Muller form, in application Ser. No. 08/231,595 entitled "Select Set-Based Technology Mapping Method and Apparatus", filed Apr. 21, 1994). Alternatively, the select sets could be determined by computing the cofactors of the logic function corresponding to CFS2, with respect to each of the input nets of the selected critical fanin section (i.e. nets a, b, c, d and e) and the complements of the input nets of the selected critical fanin section (see discussion, regarding the determination of select sets of a logic function by generating cofactors of the function, in application Ser. No. 08/231,595, entitled "Select Set-Based Technology Mapping Method and Apparatus", filed Apr. 21, 1994).

In step 903, one of the select sets (determined in step 901) of the logic function corresponding to CFS2 is selected. For the purposes of the current example, the select set $\{\bar{d}, \bar{e}\}$ is chosen, without loss of generality.

Figure 10:
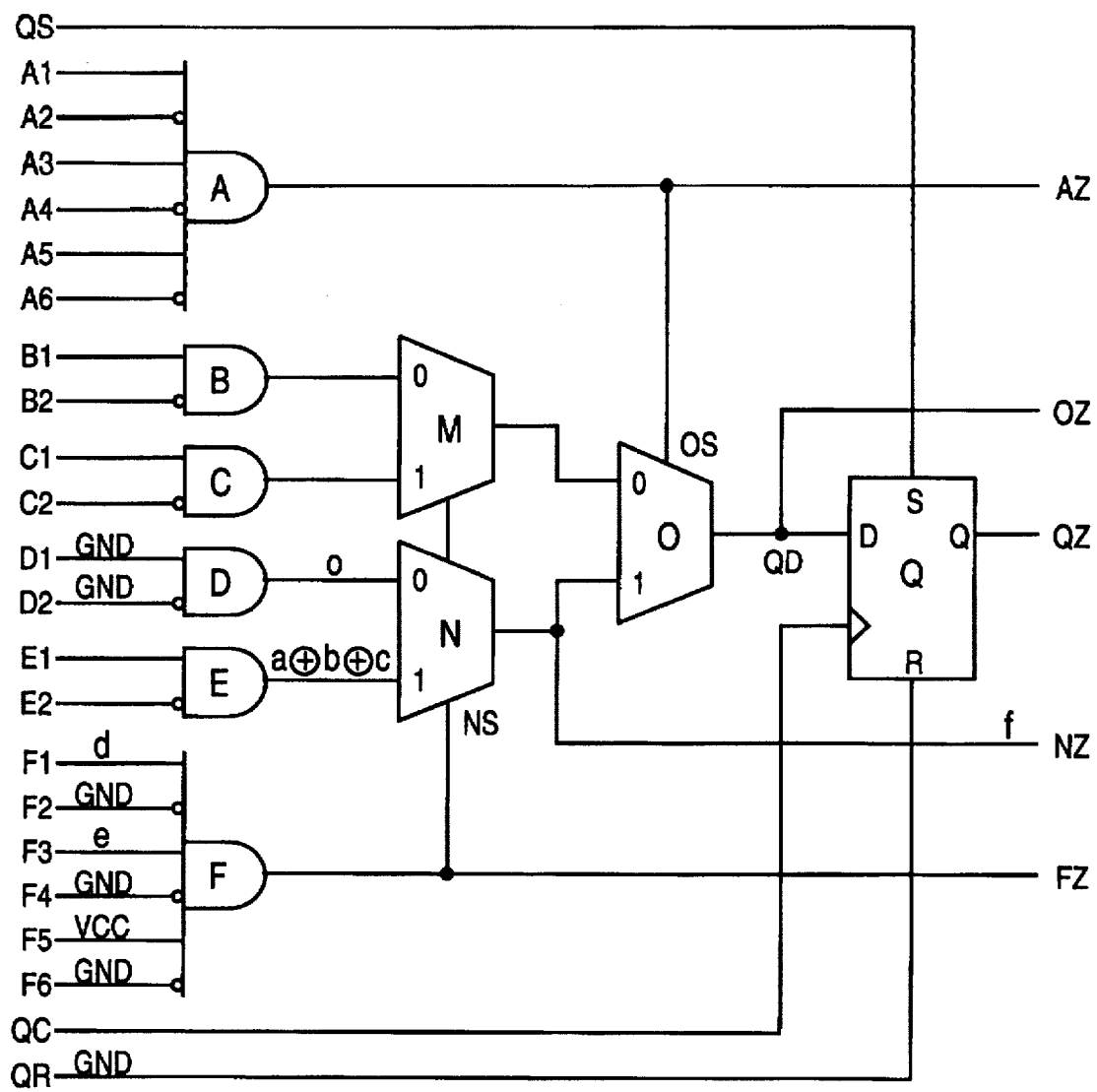
FIG. 10 depicts a first failed NZ mapping for critical fanin section CFS2.

In step 904, the logical complements of the members of the select set $\{\bar{d}, \bar{e}\}$ (i.e. d and e) are placed on uninverted inputs of AND gate F of a macrocell (macrocell 1). (The other uninverted and inverted inputs of AND gate F are tied to VCC and GND, respectively.) FIG. 10 depicts an attempted NZ mapping for the logic function corresponding to CFS2, where nets d and e are placed on inputs of AND gate F.

In step 905, the required output signals for AND gates D and E of macrocell 1 (FIG. 10) are determined. The output signal of AND gate D is determined by the multiplexer N and is supplied to the NZ macrocell output when either the signal carried on net d or the signal carried on net e is a logical 0. The output signal of AND gate D therefore must take on the value of f=(a⊕b⊕c)de, when one of d and e is 0 (i.e. 0⊕0⊕0=0). The required output signal for AND gate D can be realized by placing GND on the inputs of AND gate D so that the output of AND gate D is always 0, as shown in FIG. 10.

The output signal of AND gate E is determined by the multiplexer N and is supplied to the NZ macrocell output when the signals carried on nets d and e, respectively, are both a logical 1. The output signal of AND gate E therefore must take on the value of f=(a⊕b⊕c)de, when d and e both are 1 (i.e. a⊕b⊕c). The required output signal for AND gate E cannot be obtained by placing only literals and/or logical constants on the inputs of AND gate E. Therefore, the attempt to obtain an NZ mapping (for the logic function corresponding to CFS2) in which the complements of the members of the select set $\{\bar{d}, \bar{e}\}$ are carried on inputs of AND gate F, as illustrated in FIG. 10, fails.

Figure 11:
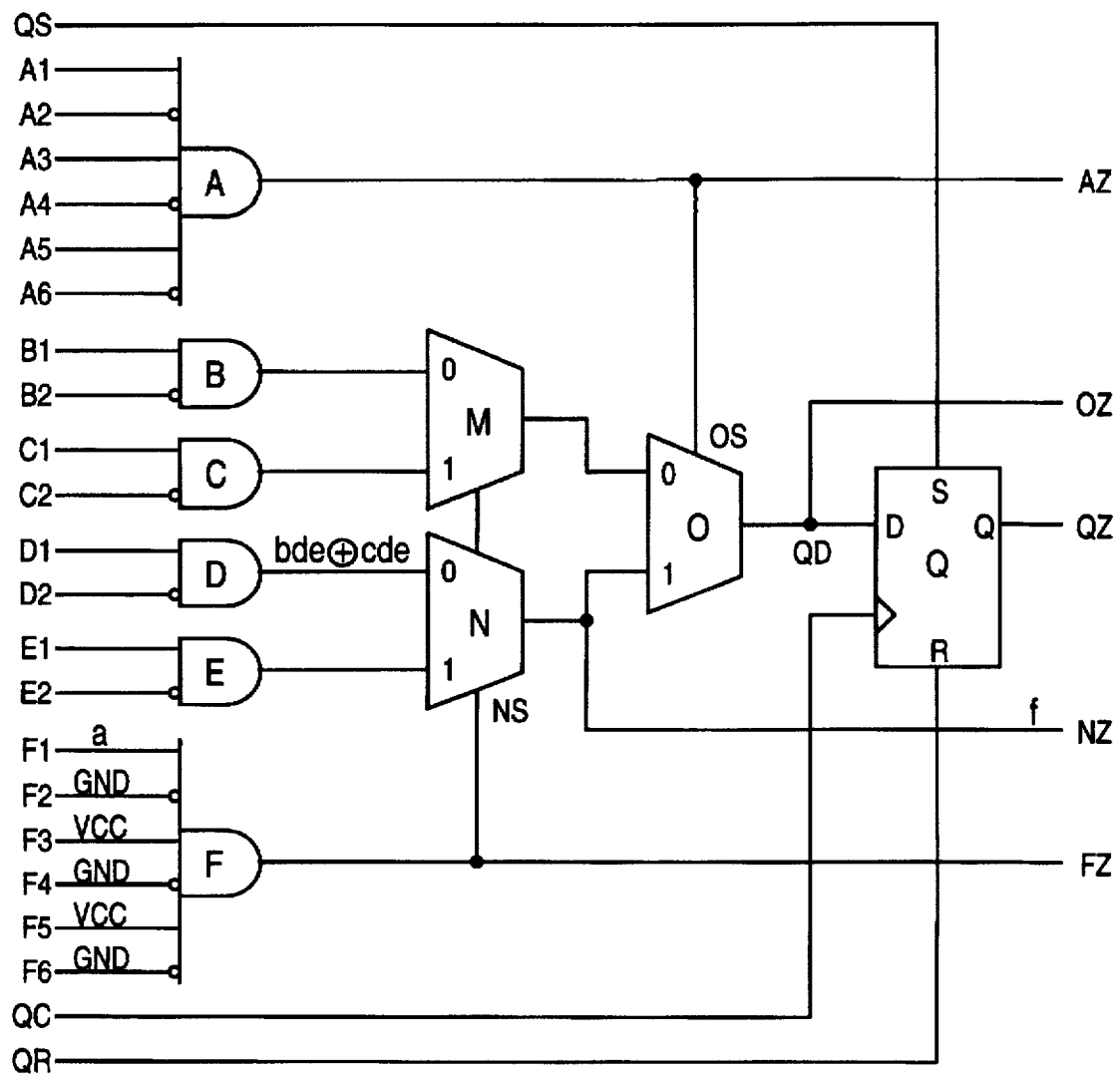
FIG. 11 depicts a second failed NZ mapping for critical fanin section CFS2.

Next, one of the select sets of the logic function corresponding to CFS2, that has not already been chosen in a previous execution of step 903 (i.e. $\{\bar{a}\}$, $\{\bar{b}\}$, and $\{\bar{c}\}$) is chosen in step 903. Without loss of generality, the select set $\{\bar{a}\}$ is chosen for the purposes of the current example. In step 904, net a is placed on an uninverted input of AND gate F as shown in FIG. 11. The other uninverted and inverted inputs of AND gate F are tied to VCC and GND, respectively. FIG. 11 depicts an attempted NZ mapping for the logic function corresponding to CFS2, where net a is placed on an input of AND gate F.

In step 905, the required output signals for AND gates D and E of macrocell 1 (FIG. 11) are determined. The output signal of AND gate D is selected by the multiplexer N and is supplied to the NZ macrocell output when the signal carried on net a is a logical 0. The output signal of AND gate D therefore must take on the value of f=(a⊕b⊕c)de, when a is 0 (i.e. (0⊕b⊕c)de=bde⊕cde). The required output signal for AND gate D cannot be obtained by placing only literals and/or logical constants on the inputs of AND gate D. Therefore, the attempt to obtain an NZ mapping (for the logic function corresponding to CFS2) in which the complement of the member of the select set $\{\bar{a}\}$ is carried on an input of AND gate F, as illustrated in FIG. 11, fails.

Next, steps 903–906 of FIG. 9 are performed, in turn, for each of the select sets of the logic function corresponding to CFS2 that have not been chosen in a previous execution of step 903 (i.e. $\{\bar{b}\}$ and $\{\bar{c}\}$). For reasons of symmetry, an NZ mapping for the logic function corresponding to CFS2 cannot be realized when the complement of the member of either of the remaining select sets, $\{\bar{b}\}$, $\{\bar{c}\}$, is placed on an input of AND gate F. Thus, an NZ mapping for the logic function corresponding to CFS2 will not be obtained and processing will finally transfer from decision step 902 to step 907, where processing according to flowchart 900 terminates. Given that the attempts to obtain AZ and NZ mappings for the logic function corresponding to CFS2 failed, an OZ mapping for f is determined (step 705). An OZ mapping is a mapping onto one or more macrocells whereby the net f is realized on the OZ output of one of the macrocells (macrocell 1).

Obtaining An OZ Mapping

Figure 12:
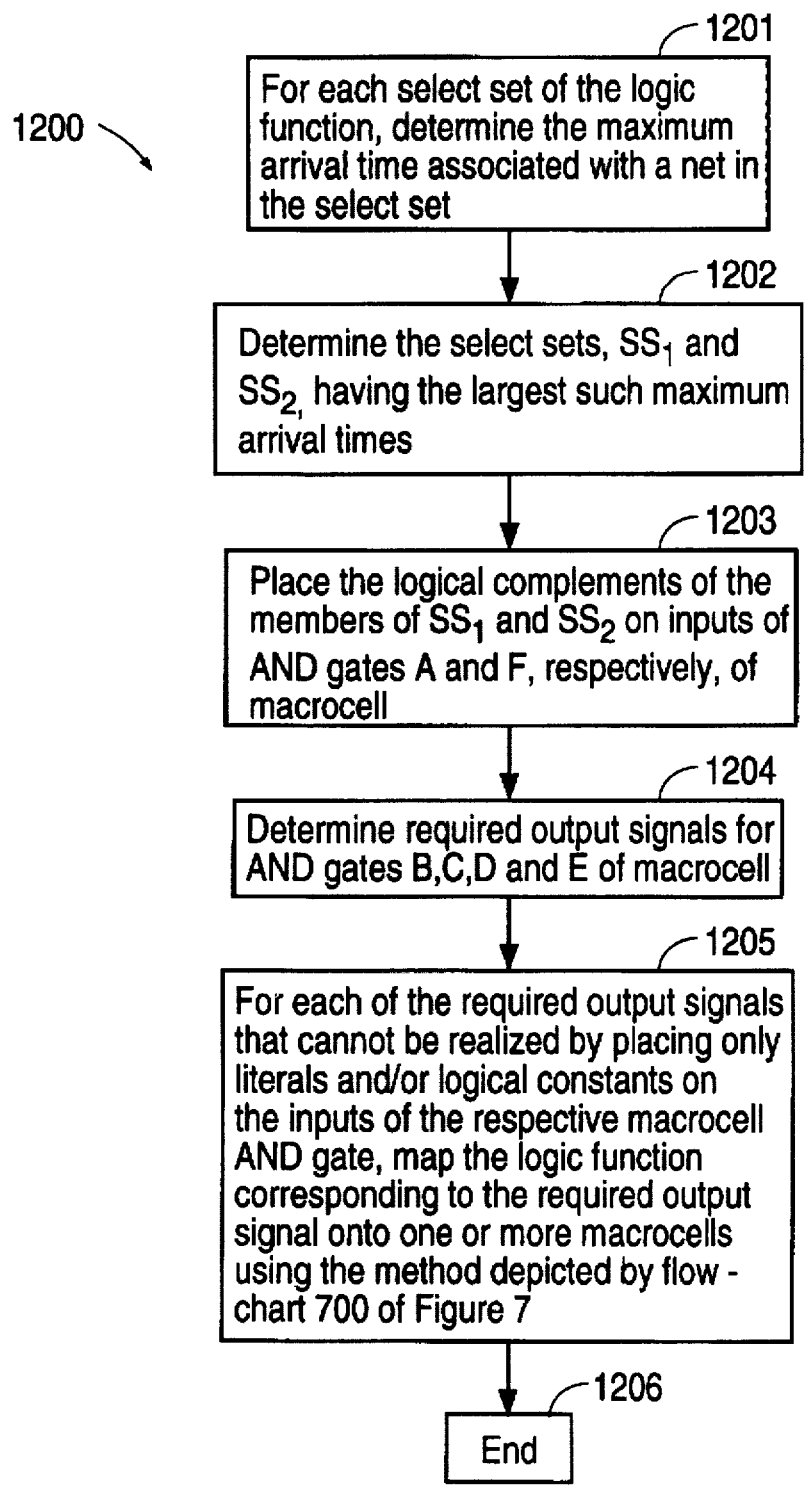
FIG. 12 is a simplified flowchart of one embodiment in accordance with the present invention.

FIG. 12 is a simplified flowchart 1200, in accordance with one embodiment of the present invention, illustrating step 705 of FIG. 7 in more detail. In this example, the steps of FIG. 12 are used to obtain an OZ mapping for the logic function corresponding to CFS2 (i.e. f=(a⊕b⊕c)de 32 ade⊕bde⊕cde).

In step 1201, for each select set of the logic function corresponding to CFS2 (i.e. $\{\bar{d}, \bar{e}\}$, $\{\bar{a}\}$, $\{\bar{b}\}$, and $\{\bar{c}\}$, which were determined in step 901 during the unsuccessful attempt to obtain an NZ mapping), the largest of the respective arrival time(s) associated with the net(s) contained in the select set is determined. For this purpose the phases of the input signals in the select sets are ignored. This largest arrival time is referred to as the "maximum arrival time of the select set". The maximum arrival times of the select sets $\{\bar{d}, \bar{e}\}$, $\{\bar{a}\}$, $\{\bar{b}\}$, and $\{\bar{c}\}$, are 6, 5, 2, and 2, respectively (as can be determined by reference to the arrival times for the nets a, b, c, d and e, as indicated in FIG. 6).

Figure 13:
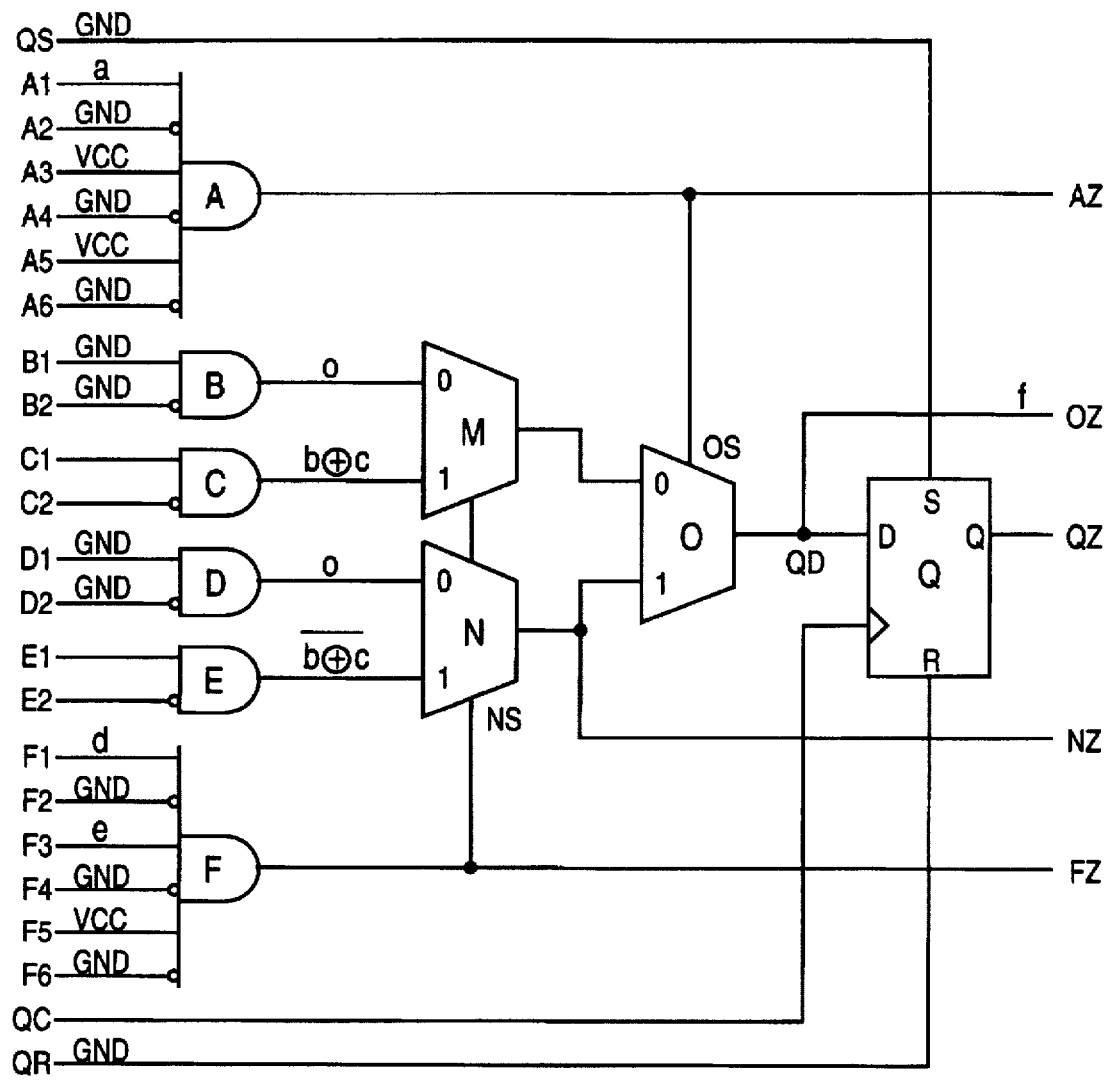
FIG. 13 depicts part of a macrocell implementation for the logic function corresponding to the output net of critical fanin section CFS2 in the mapped logic circuit of FIG. 6.

In step 1203, the complements of the members of the two select sets having the largest maximum arrival times (i.e. $\{\bar{d}, \bar{e}\}$ and $\{\bar{a}\}$) are chosen for placement onto inputs of the F and A AND gates of a macrocell (macrocell 1), respectively. Thus, net a is placed on an input of AND gate A and nets d and e are placed on respective inputs of AND gate F. All other uninverted inputs and inverted inputs of AND gates A and F are tied to VCC and ground, respectively. FIG. 13 depicts a partial OZ mapping on a macrocell (macrocell 1) of the logic function corresponding to CFS2, with nets a, d, and e placed as indicated above. The signals which must be output by AND gates B, C, D and E in order to realize f on macrocell output OZ are also indicated. The output signal of AND gate B is selected by the multiplexer O and supplied to the OZ output when the signals carried on the output nets of AND gates A and F in macrocell 1, respectively, are both a logical zero. Thus, the required signal for the output of AND gate B is equal to the value of f=ade⊕bde⊕cde, when a=0 and d or e=0 (i.e. 0⊕0⊕0=0). The required signal for the output of AND gate B of macrocell 1 can therefore be realized by tying the inputs of AND gate B to ground as illustrated in FIG. 13.

The output signal of AND gate C is selected by the multiplexer O when the signals carried on the output nets of AND gates A and F are a logical 0 and a logical 1, respectively. Thus, the required signal for the output of AND gate C of macrocell 1 is equal to the value of f when a=0 and d and e=1 (i.e. 0⊕b⊕c=b⊕c) as illustrated in FIG. 13. Thus, the required signal for the output of AND gate C of macrocell 1 cannot be realized by placing logical constants and/or literals on the inputs of AND gate C. In step 1205, the method of flowchart 700 is used to map the function b⊕c onto one or more macrocells (by first attempting an AZ mapping in step 701 and if unsuccessful, then attempting an NZ mapping in step 703, and finally if the aforementioned two attempts are unsuccessful, then obtaining an OZ mapping in step 705), as described further below.

The output signal of AND gate D is selected by the multiplexer O when the signals carried on the output nets of AND gates A and F are a logical 1 and a logical 0, respectively. Thus, the required output signal for AND gate D is equal to the value of f when a=1 and d or e=0 (i.e. 0⊕0⊕0=0) and is realized in the same manner as the required output signal of AND gate B, as described above and illustrated in FIG. 13.

The output of AND gate E is selected by the multiplexer O when the signals carried on the output nets of AND gates A and F, respectively, are both a logical 1. Thus, the required output signal for gate E of macrocell 1 is equal to the value of f when a=1 and d and e=1 (i.e. $1 \oplus b \oplus c = \overline{b \oplus c}$) as illustrated in FIG. 13. The required signal for the output of AND gate E cannot be realized by placing logical constants and/or literals on the inputs of AND gate E. Thus, in step 1205, the method of flowchart 700 will be used to map the function $\overline{b \oplus c}$, onto one or more macrocells (by first attempting an AZ mapping in step 701 and if unsuccessful, then attempting an NZ mapping in step 703, and finally if the aforementioned two attempts are unsuccessful, then obtaining an OZ mapping in step 705), as described further below.

The OZ mapping depicted by FIG. 13 is only a partial mapping because, as indicated above, the required output signals for AND gates C and E of macrocell 1 cannot be realized by placing logical constants and/or literals on the AND gate inputs. Accordingly, the logic functions corresponding to the required signals must themselves be mapped (in step 1205) onto one or more additional macrocells. These additional macrocells are then coupled to macrocell 1 of FIG. 13 to produce a complete OZ mapping for the logic function corresponding to CFS2, as discussed in more detail below.

Obtaining a Mapping for The Signal $b \oplus c$ Required For AND Gate C

In step 1205, the logic function $b \oplus c$ (the required output signal for AND gate C of macrocell 1), is mapped onto one or more macrocells using the method of flowchart 700 (FIG. 7). The macrocell in this mapping that has the output carrying the signal $b \oplus c$ is hereinafter referred to as macrocell 2.

First, in step 701, a mapping of the logic function $b \oplus c$ onto only one macrocell (macrocell 2) using only the AZ output of macrocell 2 is attempted. This attempt fails because the logic function $b \oplus c$ cannot be expressed as the product of literals.

Figure 14:
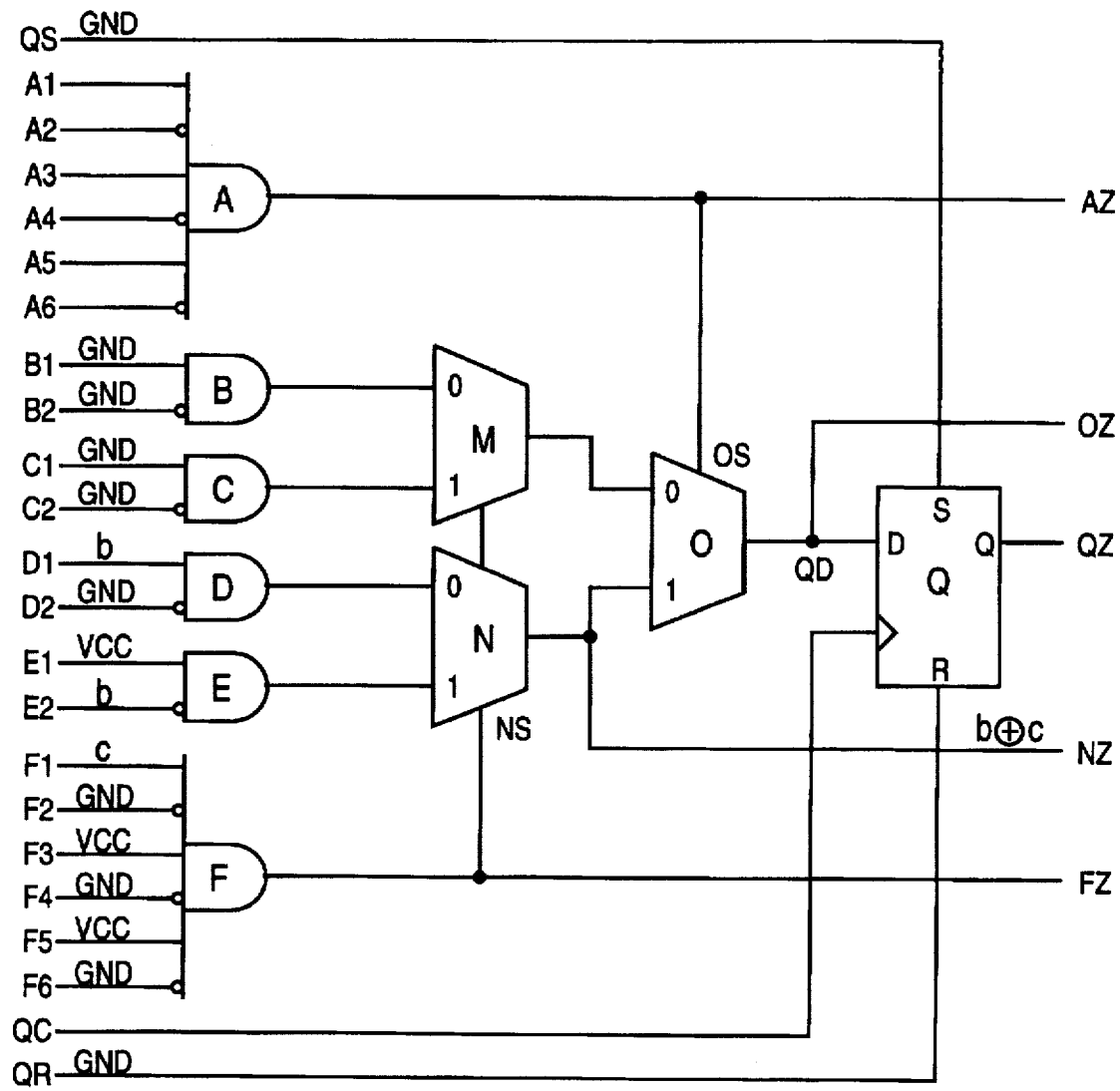
FIG. 14 depicts a macrocell implementation for the logic function b⊕c.

Next, in step 703, a mapping of the logic function $b \oplus c$ onto only one macrocell (macrocell 2) using the NZ output of macrocell 2 is attempted. As demonstrated below, this attempt to obtain an NZ mapping for the logic function $b \oplus c$ succeeds. FIG. 14 depicts one possible NZ mapping for the logic function $b \oplus c$. The execution of flowchart 900 of FIG. 9 (which, as discussed above, illustrates step 703 in more detail) for the logic function $b \oplus c$, produces the NZ mapping of FIG. 14, as discussed immediately below.

In step 901 (FIG. 9), the select sets of the logic function $b \oplus c$ are determined. Because the expression $b \oplus c$ is in greedy phase-minimized Reed Muller form, the select sets of the logic function $b \oplus c$ are easily identified as $\{\overline{b}\}$ and $\{\overline{c}\}$.

In step 903, select set $\{\overline{c}\}$ is chosen. Next, in step 904, input signal c is placed on an uninverted input of AND gate F of macrocell 2. The other uninverted and inverted inputs of AND gate F are tied to VCC and ground, respectively. In step 905, the required output signals for AND gates D and E, respectively, of macrocell 2 are determined as follows:

The output signal of AND gate D of macrocell 2 is selected by the multiplexer N driving the NZ output when the signal carried on the output net of AND gate F is a logical zero. Thus, the required output signal for AND gate D has the value of $b \oplus c$, when c=0 (i.e. b). This output signal can be realized by placing net b on the noninverted input of AND gate D and tying the inverted input of AND gate D to ground, as illustrated in FIG. 14.

The output signal of AND gate E of macrocell 2 is selected by the multiplexer N driving the NZ output when the signal carried on the output net of AND gate F is a logical 1. Thus, the required output signal for AND gate E has the value of $b \oplus c$ when c is 1 (i.e. $b \oplus 1 = \overline{b}$). This signal can be realized by placing net b on the inverted input of AND gate E and tying the uninverted input of AND gate E to VCC, as illustrated in FIG. 14. Thus, an NZ mapping of the logic function $b \oplus c$ is achieved, as illustrated in FIG. 14.

Figure 15:
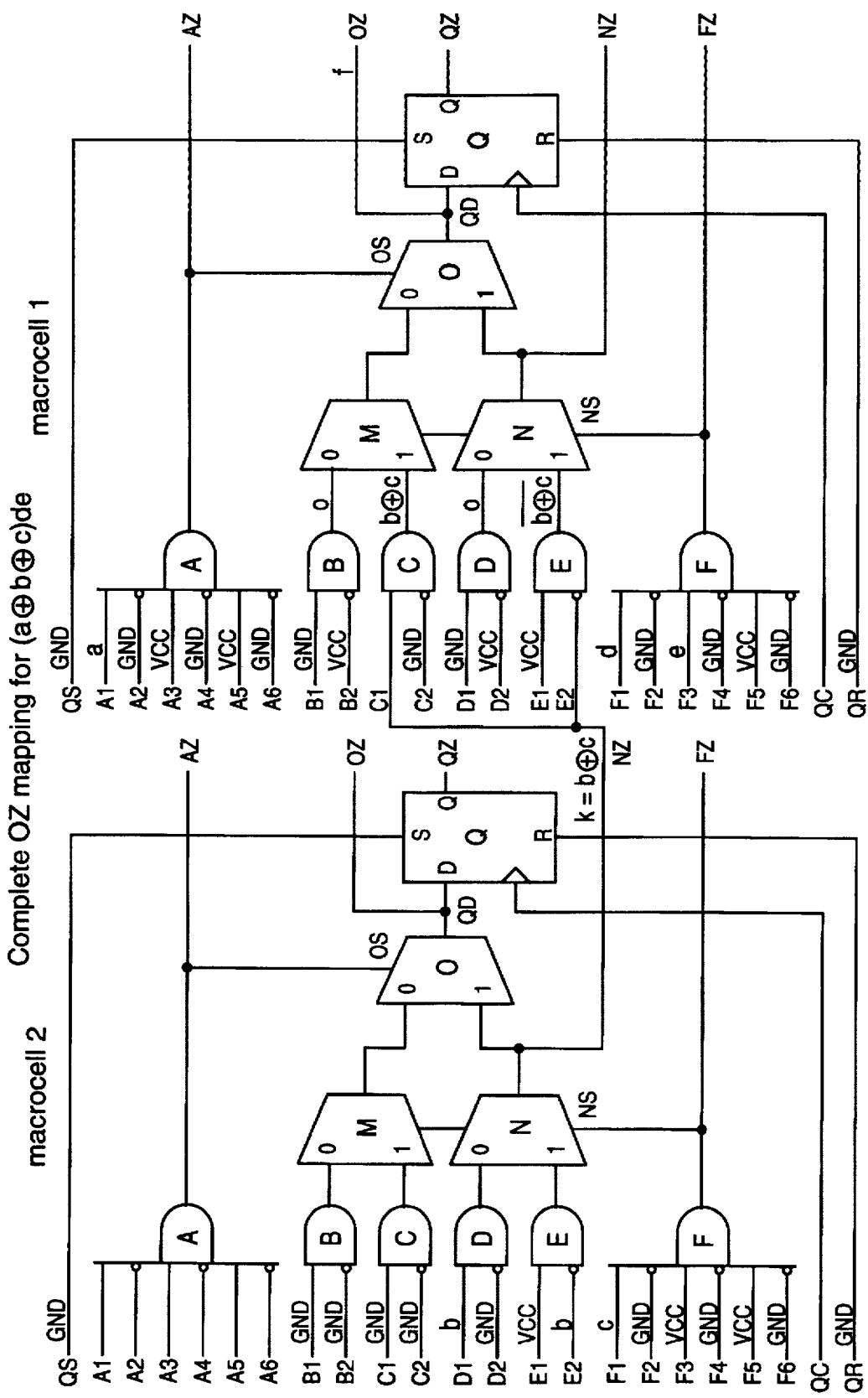
FIG. 15 depicts a two-macrocell implementation for the logic function corresponding to the output net of critical fanin section CFS2 in the mapped logic circuit of FIG. 6.

FIG. 15 depicts a complete OZ mapping for the logic function corresponding to CFS2 (i.e. $f=(a \oplus b \oplus c)de$). In FIG. 15, the NZ output of macrocell 2 (FIG. 14) is connected to the uninverted input of AND gate C of macrocell 1 (FIG. 13) and the inverted input of AND gate C of macrocell 1 is tied to ground.

Obtaining a Mapping for The Signal $\overline{b \oplus c}$ Required For AND gate E The logic function $\overline{b \oplus c}$ (the required output signal for AND gate E of macrocell 1) could be mapped in step 1205 (FIG. 12) in the same way as that described immediately above for mapping the logic function corresponding to the required output signal of AND gate C of macrocell 1.

Alternatively, in one embodiment, the mapping for the logic function corresponding to the required output signal of AND gate C of macrocell 1 (i.e. $b \oplus c$) is stored in a library once determined (as described above) in step 1205. When mapping the logic function $\overline{b \oplus c}$ corresponding to the required output signal for AND gate E of macrocell 1 in step 1205, a search of the library for a mapping for the function $\overline{b \oplus c}$ or the logical complement of the function is performed.

This search locates the mapping for the function $b \oplus c$ which is the logical complement of the required output signal for AND gate E of macrocell 1. The required output signal for AND E of macrocell 1 is realized by connecting the NZ output of macrocell 2 to the inverted input of AND gate E of macrocell 1, as indicated in FIG. 15. The uninverted input of AND gate E of macrocell 1 is tied to VCC.

Figure 16:
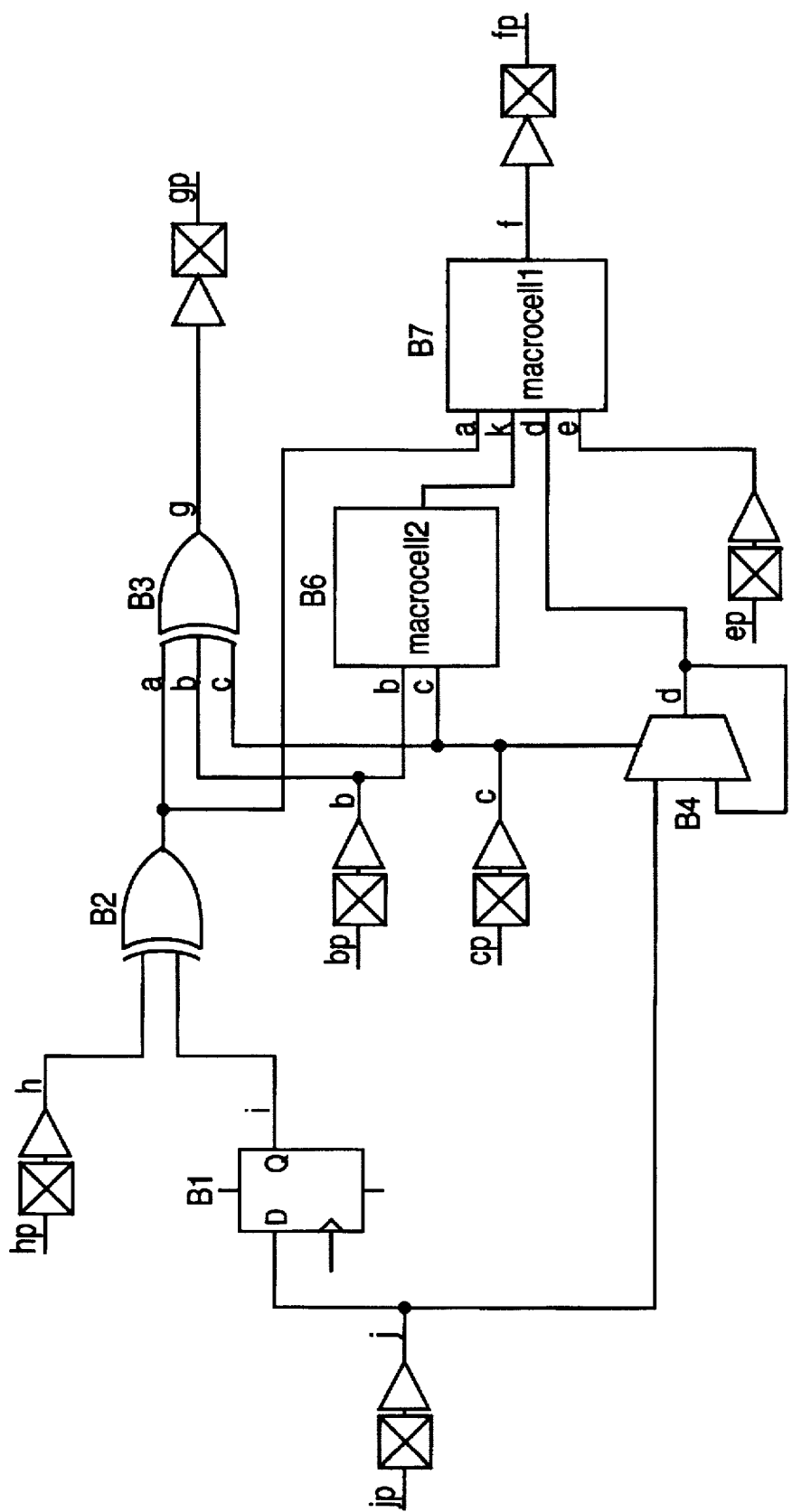
FIG. 16 depicts a mapped logic circuit resulting from the remapping of critical fanin section CFS2 in the mapped logic circuit of FIG. 6.

The result of remapping critical fanin section CFS2 in the manner described above is the OZ mapping illustrated in FIG. 15. FIG. 16 depicts the entire remapped logic circuit produced by replacing CFS2 in the mapped logic circuit of FIG. 6 with the 0Z mapping of FIG. 15. In FIG. 16, blocks B3 and B5 of the initial mapped logic circuit have been replaced by blocks B6 and B7 respectively. Block B3 has been retained in the remapped logic circuit of FIG. 16 in order to preserve net g of the initial mapped logic circuit (FIG. 6) which is required by output pad gp. In addition, a new net k, which is the NZ output of macrocell 2, has been introduced in FIG. 16 by the remapping of critical fanin section CFS2. Thus, the total number of macrocells required has increased by one as a result of the remapping.

Figure 17:
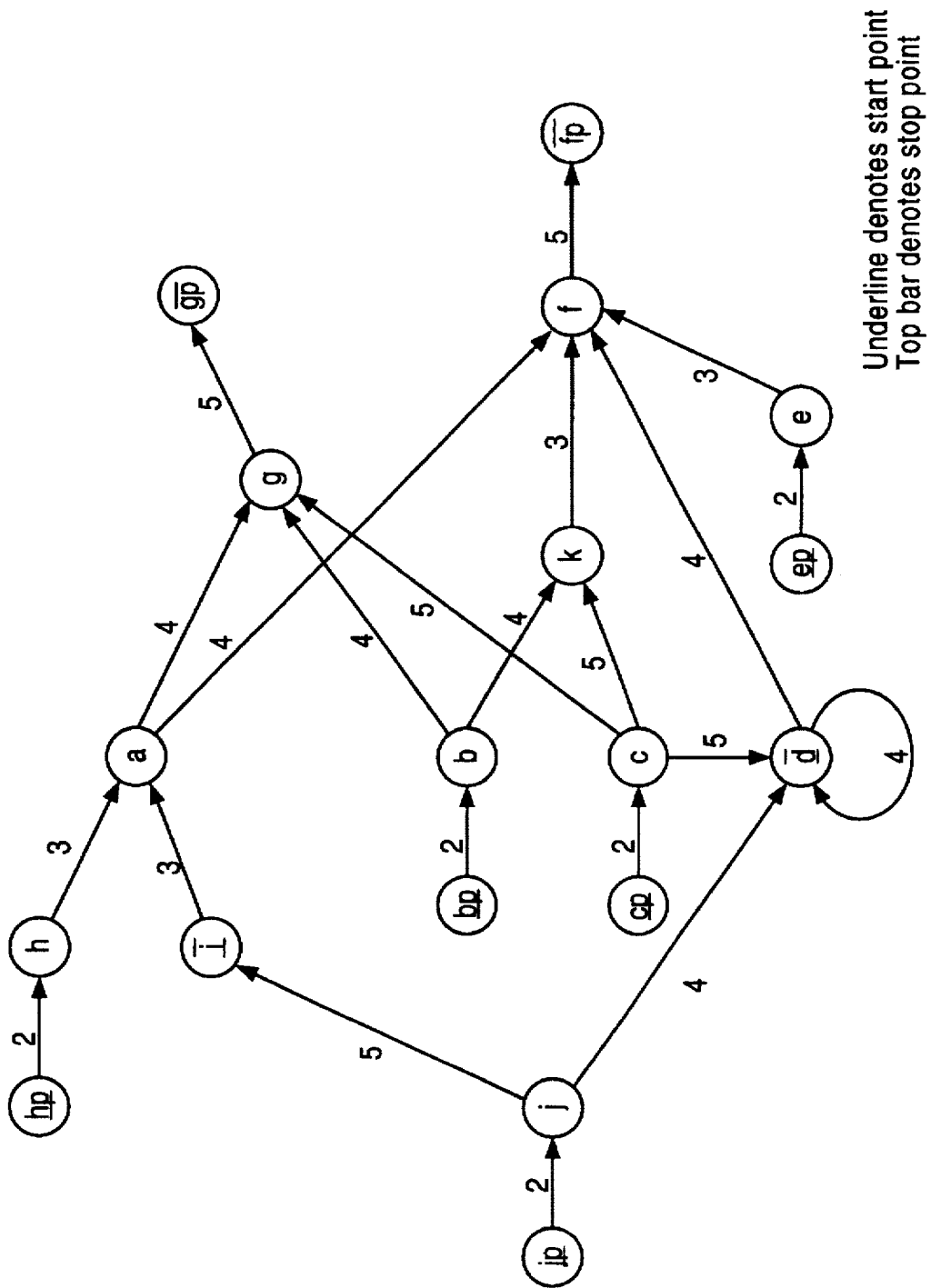
FIG. 17 depicts a net graph corresponding to the remapped logic circuit of FIG. 16.
Figure 18:
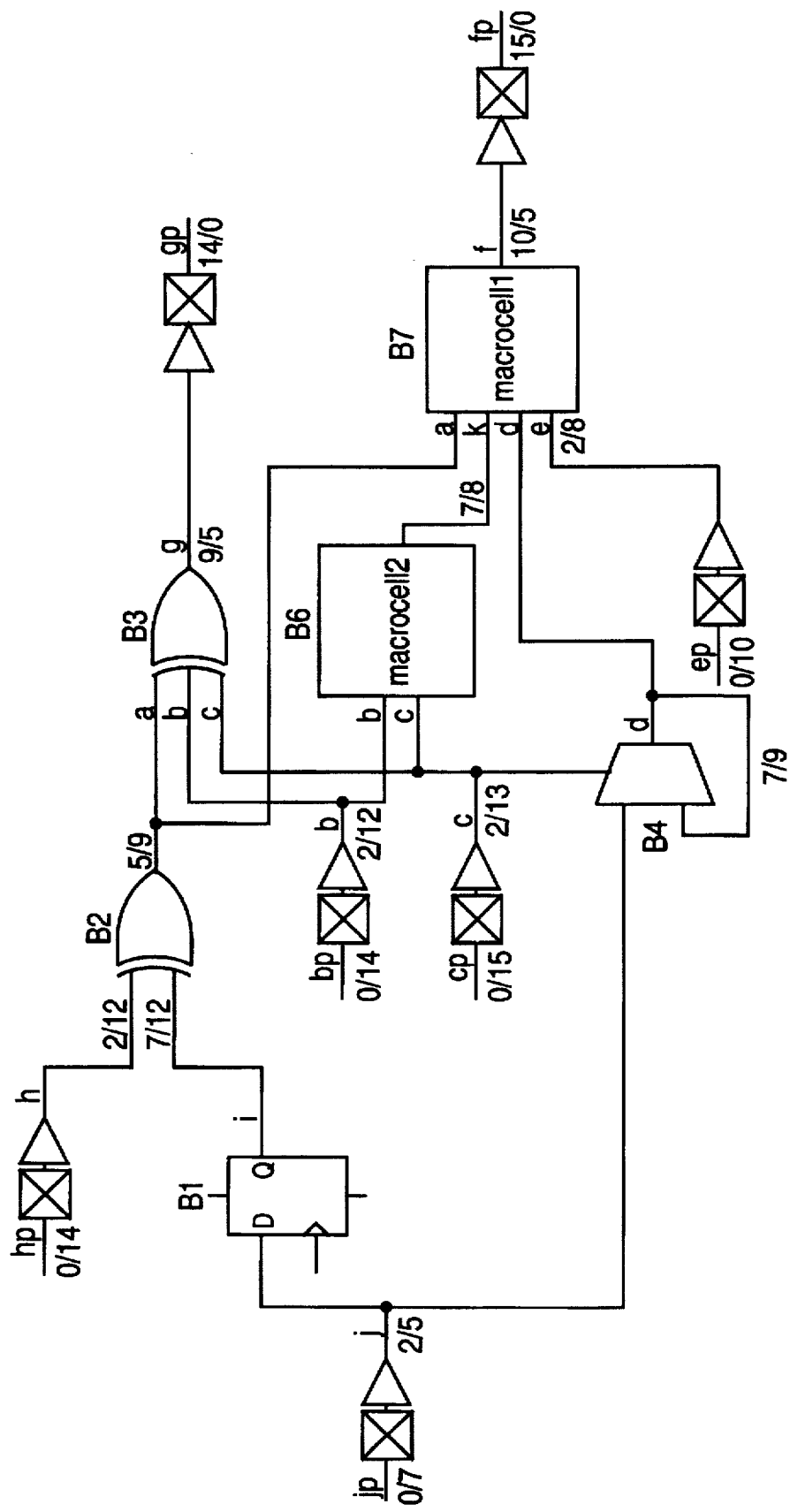
FIG. 18 depicts the remapped logic circuit of FIG. 16 with arrival and departure times indicated.

Determining Whether Or Not To Retain The Remapping Of The Selected Critical Fanin Section The arrival and departure times for the nets of the mapped logic circuit of FIG. 16 can be determined using the technique presented above (in connection with Tables 1 and 2, and accompanying text). FIG. 17 illustrates a net graph corresponding to the mapped logic circuit of FIG. 16. FIG. 18 depicts the remapped logic circuit of FIG. 16 with arrival and departure times indicated beside nets. Because the arrival time of the output net f of the remapped critical fanin section (CFS2) has been reduced from 12 to 10, the remapped logic circuit of FIG. 16 is retained and designated the "currently retained mapped logic circuit" (step 2009 of FIG. 2).

As discussed above in connection with flowchart 2000, in one embodiment the remapping of critical fanin sections is performed repeatedly until the realization of an FPGA of the current mapped logic circuit leaves an insufficient number of unused cells on the FPGA or until the remapping of each candidate critical fanin section in the current mapped logic circuit has been attempted.

Reducing Critical Path Delay

The above method obtains a second logic circuit, a net of which has an arrival time which is smaller than the corresponding net in the initial logic circuit (i.e. first logic circuit). In one embodiment, the critical path delay of the second logic circuit is smaller than the critical path delay of the first logic circuit. As discussed above, a reduction in critical path delay leads to an increase in the maximum operating speed of the circuit.

In one embodiment, the critical path delay of a mapped logic circuit is the maximum propagation delay of all paths from any start point to any stop point. A critical path is a path from a start point to a stop point having a delay equal to the critical path delay. The remapping of a critical fanin section in the first logic circuit results in a second logic circuit with a smaller critical path delay if: 1) the output net of the critical fanin section is present in each critical path of the first logic circuit; and 2) the arrival time of the corresponding net in the second logic circuit is smaller than the arrival time of the output net of the critical fanin section in the first logic circuit.

The initial (i.e. first) mapped logic circuit of FIG. 6 has exactly one critical path (i.e. the path hp-h-a-g-f-fp) and this path has a delay of 17. Thus, the critical path delay in the mapped logic circuit of FIG. 6 is 17. Given that the output net f of the remapped critical fanin section CFS2 is present in each critical path of the initial logic circuit and that the remapping of CFS2 reduces the arrival time of net f from 12 to 10 (as discussed above), the remapping of CFS2 reduces the critical path delay. Indeed, the critical path delay in the mapped logic circuit of FIG. 16 (i.e. second logic circuit) is 15 (i.e. the propagation delay associated with the single critical path cp-c-k-f-fp). The remapping of critical fanin section CFS2 therefore resulted in a reduction of 2 in critical path delay.

Realizing An Improved Mapped Logic Circuit On An FPGA

An improved mapped logic circuit obtained by applying the above-described technique can be realized on an FPGA by supplying programming data to the FPGA's programming circuitry. The programming data is used to program selected antifuses on the FPGA such that electrical connections between various inputs and outputs of the macrocells in the FPGA are created thereby realizing the improved mapped logic circuit. The format of the programming data is dependent upon the needs of the particular programming circuitry of the particular FPGA being programmed. Specific programming data formats are therefore not discussed here. The above-described method is understood to extend to the programming of numerous FPGA architectures including, for example, the memory-based macrocell architectures set forth in the 1995 Xilinx Data Book.

Microfiche Appendix

Microfiche Appendix includes various files containing routines written in the C computer programming language and compiled and linked, in one embodiment, using the Microsoft C version 8.0 compiler, available from Microsoft Corporation of Redmond, Washington. (In view of this disclosure, those skilled in the art could practice the invention using a different computer language and/or a different computer system.) The file "lrspeed.c" contains routines useful for carrying out a method such as that illustrated in FIG. 2. The file "lrpath.c" contains routines for carrying out a method for detecting loops in a mapped logic circuit (such as that illustrated in Table 1 and the accompanying text), and a method for calculating arrival and departure times in a mapped logic circuit (such as that illustrated in Table 2 and the accompanying text). The file "lrsel.c" contains routines for carrying out a method for remapping a critical fanin section (such as that illustrated by FIGS. 7-9 and 12).

The above three files manipulate an object-based representation of the mapped logic circuit in which a reduction in critical path propagation delay is desired. The file "lrbuild.c" contains routines for creating the objects in the above-mentioned representation. These routines access lower level routines (for creating objects) contained in the file "lrddr.c". The file "lrddr.c" also contains routines for accessing the objects in the representation of a mapped logic circuit. The routines contained in the file "lrddr.c" are also accessed by routines contained in the files "lrpath.c", "lrspeed.c" and "lrsel.c".

In order to use the routines provided in the Microfiche Appendix, an application is created that:

1) makes calls to routines contained in the file "lrbuild.c" in order to create an object-based representation (corresponding to the initial mapped logic circuit in which a reduction in critical path propagation delay is desired) that is in the format expected by the routines contained in the files "lrpath.c", "lrspeed.c" and "lrsel.c"; and 2) contains a routine (similar to routine "lrSpeedUpDesign" contained in the file "lrspeed.c") for reducing critical path delay in the mapped logic circuit. This routine calls routines contained in the file "lrspeed.c" such as the routine "findBlockScore" (for computing the score of a candidate critical fanin section) and the routine "chooseBlockForSpeedup" (for selecting a critical fanin section).

Although certain specific embodiments are described above in order to illustrate the invention, the invention is not limited to the specific embodiments. Accordingly, various modifications, adaptations and combinations of various features of the specific embodiments are within the scope of the claimed invention as set forth in the following claims.

What is claimed is:

1. A method, comprising:

determining select sets of a logic function corresponding to an output of a first logic circuit, said first logic circuit also having an input, a first propagation delay existing from said input to said output; and using said select sets to determine a second logic circuit, said logic function corresponding to an output of said second logic circuit, said second logic circuit also having an input, a second propagation delay existing from said input to said output of said second logic circuit, said second propagation delay being smaller than said first propagation delay.

2. A method, comprising:

determining select sets of a logic function corresponding to an output of a first logic circuit, said first logic circuit also having an input, a first propagation delay existing from said input to said output; and using said select sets to determine a second logic circuit, said logic function corresponding to an output of said second logic circuit, said second logic circuit also having an input, a second propagation delay existing from said input to said output of said second logic circuit, said second propagation delay being smaller than said first propagation delay, wherein said first logic circuit is a critical fanin section.

3. The method of claim 1, further comprising:

implementing said second logic circuit on a field programmable gate array by programming antifuses of said field programmable gate array.

4. A method, comprising:
- selecting a portion of a first logic circuit, the first logic circuit having one or more inputs and one or more outputs, the portion of the first logic circuit having one or more inputs and an output;
- determining select sets of a logic function, the logic function corresponding to the output of the portion of the first logic circuit; and
- using the select sets to determine a second logic circuit, the second logic circuit having one or more inputs and one or more outputs, each respective one of the inputs of the second logic circuit corresponding to a respective one of the inputs of the first logic circuit, each respective one of the outputs of the second logic circuit corresponding to a respective one of the outputs of the first logic circuit, a portion of the second logic circuit having one or more inputs and an output, each respective one of the inputs of the portion of the second logic circuit corresponding to a respective one of the inputs of the portion of the first logic circuit, the output of the portion of the second logic circuit corresponding to the output of the portion of the first logic circuit, the logic function also corresponding to the output of the portion of the second logic circuit.

5. The method of claim 4, wherein said determining select sets comprises generating a greedy phase-minimized expression in Reed-Muller form for the logic function.

6. The method of claim 4, wherein the first and second logic circuits are mapped onto one or more macrocells of a field programmable gate array, and said using the select sets comprises remapping the selected portion of the first logic circuit onto one or more macrocells of the field programmable gate array.

7. The method of claim 6, further comprising generating programming data and loading said programming data into said field programmable gate array.

8. The method of claim 7, further comprising using the programming data to program the field programmable gate array thereby realizing the implementation of the second logic circuit on the one or more macrocells of the field programmable gate array.

9. A method, comprising:
- selecting a portion of a first logic circuit, the first logic circuit having one or more inputs and one or more outputs, the portion of the first logic circuit having one or more inputs and an output;
- determining select sets of a logic function, the logic function corresponding to the output of the portion of the first logic circuit; and
- using the select sets to determine a second logic circuit, the second logic circuit having one or more inputs and one or more outputs, each respective one of the inputs of the second logic circuit corresponding to a respective one of the inputs of the first logic circuit, each respective one of the outputs of the second logic circuit corresponding to a respective one of the outputs of the first logic circuit, a portion of the second logic circuit having one or more inputs and an output, each respective one of the inputs of the portion of the second logic circuit corresponding to a respective one of the inputs of the portion of the first logic circuit, the output of the portion of the second logic circuit corresponding to the output of the portion of the first logic circuit, the logic function also corresponding to the output of the portion of the second circuit,
- wherein the first and second logic circuits are mapped onto one or more macrocells of a field programmable gate array, and said using the select sets comprises remapping the selected portion of the first logic circuit onto one or more macrocells of the field programmable gate array, and
- wherein each of the one or more macrocells comprises a first multiplexer having an output lead, a second multiplexer having an output lead and a third multiplexer having a first input lead and a second input lead, the output lead of the first multiplexer being coupled to the first input lead of the third multiplexer, the output lead of the second multiplexer being coupled to the second input lead of the third multiplexer.

10. The method of claim 6, wherein each of the one or more macrocells comprises a sequential logic element.

11. The method of claim 6, wherein each of the one or more macrocells comprises a multi-bit memory.

12. A method, comprising:
- selecting a portion of a first logic circuit, the first logic circuit having one or more inputs and one or more outputs, the portion of the first logic circuit having one or more inputs and an output;
- determining select sets of a logic function, the logic function corresponding to the output of the portion of the first logic circuit; and
- using the select sets to determine a second logic circuit, the second logic circuit having one or more inputs and one or more outputs, each respective one of the inputs of the second logic circuit corresponding to a respective one of the inputs of the first logic circuit, each respective one of the outputs of the second logic circuit corresponding to a respective one of the outputs of the first logic circuit, a portion of the second logic circuit having one or more inputs and an output, each respective one of the inputs of the portion of the second logic circuit corresponding to a respective one of the inputs of the portion of the first logic circuit, the output of the portion of the second logic circuit corresponding to the output of the portion of the first logic circuit, the logic function also corresponding to the output of the portion of the second circuit,
- wherein the first and second logic circuits are mapped onto one or more macrocells of a field programmable gate array, and said using the select sets comprises remapping the selected portion of the first logic circuit onto one or more macrocells of the field programmable gate array, and
- wherein the selected portion of the first logic circuit comprises a first block of combinational logic and a second block of combinational logic, each of the first and second combinational blocks being mapped onto a respective one of the one or more macrocells of the field programmable gate array and having an output and one or more inputs, and the output of the first block of combinational logic being one of the inputs of the second block of combinational logic.

13. The method of claim 4, wherein a propagation delay in the second logic circuit is less than a propagation delay in the first logic circuit, the propagation delay in the second logic circuit corresponding to the propagation delay in the first logic circuit.

14. The method of claim 4, wherein the second logic circuit has a critical path delay and wherein the first logic circuit has a critical path delay, the critical path delay of the second logic circuit being smaller than the critical path delay of the first logic circuit.

15. The method of claim 4, wherein an arrival time in the second logic circuit is less than an arrival time in the first logic circuit, the arrival time in the second logic circuit corresponding to the arrival time in the first logic circuit.

16. A method, comprising:

using select sets to remap a portion of a first logic circuit thereby obtaining a second logic circuit; and configuring a field programmable logic circuit to implement said second logic circuit on said field programmable gate array.

17. The method of claim 16, wherein said configuring involves programming antifuses.

18. A method of implementing a logic circuit on a field programmable gate array, comprising the steps of:

determining one or more select sets of a logic function representing an output signal of the logic circuit, at least one of the select sets having at least one inverted variable;

determining an implementation, based on the one or more select sets, for the logic circuit on the field programmable gate array; and programming the field programmable gate array to realize the implementation.

* * * * *